(12) United States Patent
Yamazaki et al.

(10) Patent No.: US 7,964,429 B2
(45) Date of Patent: Jun. 21, 2011

(54) METHOD FOR MANUFACTURING PHOTOELECTRIC CONVERSION DEVICE

(75) Inventors: Shunpei Yamazaki, Tokyo (JP);
Yasuyuki Arai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/260,302

(22) Filed: Oct. 29, 2008

(65) Prior Publication Data
US 2009/0117680 A1    May 7, 2009

(30) Foreign Application Priority Data

Nov. 1, 2007   (JP) ................................. 2007-285252
Nov. 1, 2007   (JP) ................................. 2007-285253

(51) Int. Cl.
*H01L 21/00*   (2006.01)
(52) U.S. Cl. ........................... 438/57; 438/455; 438/458
(58) Field of Classification Search .................... 438/57, 438/455, 458, 459
See application file for complete search history.

(56) References Cited

U.S. PATENT DOCUMENTS

| | | | |
|---|---|---|---|
| 4,180,618 A | 12/1979 | Alpha et al. | |
| 4,633,034 A | 12/1986 | Nath et al. | |
| 4,665,277 A | 5/1987 | Sah et al. | |
| 5,259,891 A | 11/1993 | Matsuyama et al. | |
| 5,328,519 A | 7/1994 | Kawakami | |
| 5,374,564 A | 12/1994 | Bruel | |
| 5,665,607 A | 9/1997 | Kawama et al. | |
| 5,811,348 A | 9/1998 | Matsushita et al. | |
| 6,110,845 A | 8/2000 | Seguchi et al. | |
| 6,127,702 A | 10/2000 | Yamazaki et al. | |
| 6,242,320 B1 | 6/2001 | So | |

(Continued)

FOREIGN PATENT DOCUMENTS

EP    1 088 913    4/2001
(Continued)

OTHER PUBLICATIONS

Xiang Lu, s. Sundar Kumar Iyer, Chenming Hu, Nathan W. Cheung, Jing Min, Zhineng fan and Paul K. Chu, "Ion-cut silicon-on-insulator fabrication with plasma immersion ion implantation," Nov. 10, 1997, Applied Physics Letters, vol. 71 issue 19, p. 2767-2769.*

(Continued)

*Primary Examiner* — Charles D Garber
*Assistant Examiner* — Bryan R Junge
(74) *Attorney, Agent, or Firm* — Eric J. Robinson; Robinson Intellectual Property Law Office, P.C.

(57) ABSTRACT

A photoelectric conversion device which is excellent in photoelectric conversion characteristics is provided by effectively utilizing silicon semiconductor materials. The present invention relates to a method for manufacturing a photoelectric conversion device using a solar cell, in which a plurality of single crystal semiconductor substrates in each of which a damaged layer is formed at a predetermined depth is arranged over a supporting substrate having an insulating surface; a surface layer part of the single crystal semiconductor substrate is separated thinly using the damaged layer as a boundary so as to form a single crystal semiconductor layer over one surface of the supporting substrate; and the single crystal semiconductor layer is irradiated with a laser beam from a surface side which is exposed by separation of the single crystal semiconductor layer to planarize the surface of the single crystal semiconductor layer.

36 Claims, 29 Drawing Sheets

U.S. PATENT DOCUMENTS

| | | | |
|---|---|---|---|
| 6,258,698 B1 * | 7/2001 | Iwasaki et al. | 438/455 |
| 6,271,101 B1 | 8/2001 | Fukunaga | |
| 6,312,797 B1 | 11/2001 | Yokokawa et al. | |
| 6,331,208 B1 | 12/2001 | Nishida et al. | |
| 6,335,231 B1 | 1/2002 | Yamazaki et al. | |
| 6,372,609 B1 | 4/2002 | Aga et al. | |
| 6,380,046 B1 | 4/2002 | Yamazaki | |
| 6,388,652 B1 | 5/2002 | Yamazaki et al. | |
| 6,468,884 B2 | 10/2002 | Miyake et al. | |
| 6,486,041 B2 | 11/2002 | Henley et al. | |
| 6,534,380 B1 | 3/2003 | Yamauchi et al. | |
| 6,566,277 B1 | 5/2003 | Nakagawa et al. | |
| 6,602,761 B2 | 8/2003 | Fukunaga | |
| 6,686,623 B2 | 2/2004 | Yamazaki | |
| 6,692,981 B2 * | 2/2004 | Takato et al. | 438/57 |
| 6,720,237 B2 | 4/2004 | Iwasaki et al. | |
| 6,778,164 B2 | 8/2004 | Yamazaki et al. | |
| 6,803,264 B2 | 10/2004 | Yamazaki et al. | |
| 6,818,529 B2 | 11/2004 | Bachrach et al. | |
| 6,875,633 B2 | 4/2005 | Fukunaga | |
| 6,906,383 B1 * | 6/2005 | Zhang et al. | 257/347 |
| 6,908,797 B2 | 6/2005 | Takano | |
| 6,927,148 B2 | 8/2005 | Ito | |
| 7,119,365 B2 | 10/2006 | Takafuji et al. | |
| 7,148,124 B1 | 12/2006 | Usenko | |
| RE39,484 E | 2/2007 | Bruel | |
| 7,176,525 B2 | 2/2007 | Fukunaga | |
| 7,176,528 B2 | 2/2007 | Couillard et al. | |
| 7,192,844 B2 | 3/2007 | Couillard et al. | |
| 7,199,024 B2 | 4/2007 | Yamazaki | |
| 7,256,776 B2 | 8/2007 | Yamazaki et al. | |
| 7,399,681 B2 | 7/2008 | Couillard et al. | |
| 7,476,940 B2 | 1/2009 | Couillard et al. | |
| 7,508,034 B2 | 3/2009 | Takafuji et al. | |
| 7,531,428 B2 * | 5/2009 | Dupont | 438/458 |
| 7,605,053 B2 | 10/2009 | Couillard et al. | |
| 7,619,250 B2 | 11/2009 | Takafuji et al. | |
| 7,632,739 B2 | 12/2009 | Hebras | |
| 7,790,570 B2 | 9/2010 | Yamazaki | |
| 7,816,736 B2 | 10/2010 | Yamazaki | |
| 7,834,398 B2 | 11/2010 | Yamazaki | |
| 7,838,935 B2 | 11/2010 | Couillard et al. | |
| 2002/0036011 A1 | 3/2002 | Takato et al. | |
| 2002/0109144 A1 | 8/2002 | Yamazaki | |
| 2002/0132449 A1 * | 9/2002 | Iwasaki et al. | 438/458 |
| 2003/0148565 A1 * | 8/2003 | Yamanaka | 438/200 |
| 2003/0183876 A1 | 10/2003 | Takafuji et al. | |
| 2004/0038505 A1 | 2/2004 | Ito et al. | |
| 2004/0056332 A1 | 3/2004 | Bachrach et al. | |
| 2004/0087111 A1 | 5/2004 | Iwasaki et al. | |
| 2004/0104424 A1 | 6/2004 | Yamazaki | |
| 2005/0003594 A1 * | 1/2005 | Koezuka et al. | 438/166 |
| 2005/0009252 A1 | 1/2005 | Yamazaki et al. | |
| 2005/0014859 A1 | 1/2005 | Iyama et al. | |
| 2005/0022864 A1 | 2/2005 | Fujioka et al. | |
| 2005/0042798 A1 | 2/2005 | Nagao et al. | |
| 2005/0255670 A1 * | 11/2005 | Couillard et al. | 438/455 |
| 2005/0260800 A1 | 11/2005 | Takano | |
| 2005/0285231 A1 * | 12/2005 | Arao et al. | 257/635 |
| 2006/0038228 A1 | 2/2006 | Aitken et al. | |
| 2006/0065299 A1 | 3/2006 | Fukawa et al. | |
| 2006/0068563 A1 | 3/2006 | Wong et al. | |
| 2006/0099773 A1 | 5/2006 | Maa et al. | |
| 2006/0110899 A1 | 5/2006 | Bourdelle et al. | |
| 2007/0020947 A1 | 1/2007 | Daval et al. | |
| 2007/0063281 A1 | 3/2007 | Takafuji et al. | |
| 2007/0087488 A1 | 4/2007 | Moriwaka | |
| 2007/0108510 A1 | 5/2007 | Fukunaga | |
| 2007/0141803 A1 | 6/2007 | Boussagol et al. | |
| 2007/0173000 A1 | 7/2007 | Yamazaki | |
| 2007/0184632 A1 | 8/2007 | Yamazaki et al. | |
| 2007/0238312 A1 | 10/2007 | Murakami et al. | |
| 2007/0281172 A1 | 12/2007 | Couillard et al. | |
| 2007/0281440 A1 | 12/2007 | Cites et al. | |
| 2007/0291022 A1 | 12/2007 | Yamazaki et al. | |
| 2008/0061301 A1 | 3/2008 | Yamazaki | |
| 2008/0067529 A1 | 3/2008 | Yamazaki | |
| 2008/0160661 A1 | 7/2008 | Henley | |
| 2008/0171443 A1 | 7/2008 | Hebras | |
| 2008/0213953 A1 | 9/2008 | Yamazaki | |
| 2008/0245406 A1 | 10/2008 | Yamazaki et al. | |
| 2008/0246109 A1 | 10/2008 | Ohnuma et al. | |
| 2008/0251126 A1 | 10/2008 | Yamazaki et al. | |
| 2008/0261376 A1 | 10/2008 | Yamazaki et al. | |
| 2008/0286941 A1 | 11/2008 | Yamazaki | |
| 2008/0286942 A1 | 11/2008 | Yamazaki | |
| 2008/0286952 A1 | 11/2008 | Miyairi et al. | |
| 2009/0023267 A1 | 1/2009 | Daval et al. | |
| 2009/0023271 A1 | 1/2009 | Couillard et al. | |
| 2009/0095956 A1 | 4/2009 | Takafuji et al. | |
| 2010/0019242 A1 | 1/2010 | Takafuji et al. | |

FOREIGN PATENT DOCUMENTS

| | | | |
|---|---|---|---|
| EP | 1505174 A | 2/2005 | |
| JP | 01-227307 A | 9/1989 | |
| JP | 07-226528 | 8/1995 | |
| JP | 10-093122 | 4/1998 | |
| JP | 10-093122 A | 4/1998 | |
| JP | 10-335683 | 12/1998 | |
| JP | 11-163363 A | 6/1999 | |
| JP | 2000-077287 | 3/2000 | |
| JP | 2000-150940 | 5/2000 | |
| JP | 2001-077044 | 3/2001 | |
| JP | 2001-160540 | 6/2001 | |
| JP | 2002-050781 | 2/2002 | |
| JP | 2002-100789 | 4/2002 | |
| JP | 2002-231628 | 8/2002 | |
| JP | 2002-343946 | 11/2002 | |
| JP | 2002-348198 | 12/2002 | |
| JP | 2003-017723 | 1/2003 | |
| JP | 2003-324188 A | 11/2003 | |
| JP | 2004-014958 | 1/2004 | |
| JP | 2004-087667 A | 3/2004 | |
| JP | 2005-050905 | 2/2005 | |
| JP | 2005-129602 | 5/2005 | |
| JP | 2005-252244 A | 9/2005 | |
| JP | 2005-268682 | 9/2005 | |
| JP | 2006-332162 | 12/2006 | |

OTHER PUBLICATIONS

Wolf, S., Tauber, R.N., Silicon Processing for the VLSI Era vol. 1—Process Technology, 2000, Lattice Press p. 260-261.*

International Search Report (Application No. PCT/JP2008/069708) dated Dec. 2, 2008.

Written Opinion (Application No. PCT/JP2008/069708) dated Dec. 2, 2008.

International Search Report (Application No. PCT/JP2008/055350) dated Jun. 24, 2008.

Written Opinion (Application No. PCT/JP2008/055350) dated Jun. 24, 2008.

Kahlert.H et al., "UV-Optics for Excimer Laser Based Ctystallization Processes,", Mat. Res. Soc. Symp. Proc. (Materials Research Society Symposia Proceedings), 2001, vol. 685, pp. D6.2.1-D6.2.6.

* cited by examiner

METHOD FOR MANUFACTURING PHOTOELECTRIC CONVERSION DEVICE

TECHNICAL FIELD

The present invention relates to a method for manufacturing a photoelectric conversion device using a semiconductor layer, and particularly relates to a photoelectric conversion device using a single crystal semiconductor layer.

BACKGROUND ART

As a measure against global warming, solar photovoltaics become popular around the world. The total production of solar cells in the world in 2005 was 1, 759 MW, which is an increase by 147% over the previous fiscal year. At present, the popular solar cell is crystal solar cells, and solar cells using single crystal silicon or polycrystalline silicon account for the large part of the production. These solar cells use a silicon wafer as a base, which is formed by slicing a large-sized silicon ingot into a circle.

In a crystal solar cell using silicon as a material, a thickness of a silicon wafer which is sufficient to absorb sun light is about 10 μm. However, an actual silicon wafer has a thickness of about 200 μm to 300 μm. This means that a silicon wafer which is used for the crystal solar cell is more than or equal to ten times as thick as the silicon wafer needed to be for photoelectric conversion and it is difficult to say that a silicon wafer is used effectively. In extreme terms, most of silicon wafers only functions as a structure for maintaining the shape of the solar cells.

As production of solar cells increases, shortage in supply of polycrystalline silicon, which is a material of silicon, and steep price rise of silicon wafers become problems in industry. The production of polycrystalline silicon in 2007 is expected to be about 36 thousand tons; however, polycrystalline silicon which is demanded for semiconductors (LSI) is 25 thousand tons or more, and for solar cells is 20 thousand tons or more, whereby shortage in supply of polycrystalline silicon is excepted to be about 10 thousand tons. Furthermore, it is expected that such a shortage in supply will continue.

However, development of crystal thin film silicon solar cells has been proceeding in anticipation of these circumstances. For example, a method for manufacturing a silicon thin film solar cell in which a crystalline silicon film is deposited over a substrate by using a VHF which is 27 MHz or more and pulse modulating the VHF, is disclosed (see Patent Document 1: Japanese Published Patent Application No. 2005-50905). Further, a technique for controlling plasma treatment conditions to optimize addition of a dopant to crystal grains and crystal grain boundaries when a thin film polycrystalline silicon film is formed by a plasma CVD method over a special electrode called a texture electrode which has minute unevenness on its surface, is disclosed (see Patent Document 2: Japanese Published Patent Application No. 2004-14958).

DISCLOSURE OF INVENTION

However, a crystal thin film silicon solar cell is still inferior to a single crystal silicon solar cell in terms of photoelectric conversion characteristics because of low crystal quality. Further, a crystal thin film silicon solar cell has a problem in that a crystal silicon film needs to be formed by a chemical vapor deposition method to have a thickness of 1 μm or more and the productivity is low. Furthermore, a yield of a gas needed for film formation is low; therefore, a sufficient advantage in a crystal thin film silicon solar cell has not also been found from an economic stand point.

In other words, in a crystal thin film silicon solar cell, a photoelectric conversion layer is formed by a deposition technique such as a plasma CVD method; however, it is necessary that a large amount of semiconductor material gas flow for increasing deposition speed, resulting in a problem of low productivity. On the other hand, the demand of the silicon wafer is tightened, and thus, there is a problem that the supply cannot keep up with the demand.

In view of the foregoing, it is an object to efficiently use silicon semiconductor materials, and to provide a method for manufacturing a photoelectric conversion device which is excellent in photoelectric conversion characteristics.

The present invention relates to a method for manufacturing a photoelectric conversion device using a solar cell, in which a plurality of single crystal semiconductor substrates in each of which a damaged layer is formed at a predetermined depth is arranged over a supporting substrate having an insulating surface; a surface layer part of the single crystal semiconductor substrate is separated thinly using the damaged layer as a boundary so as to form a single crystal semiconductor layer over one surface of the supporting substrate; and the single crystal semiconductor layer is irradiated with a laser beam from a surface side which is exposed by separating the single crystal semiconductor layer to melt and re-single-crystallize at least a surface layer of the region irradiated with the laser beam.

One aspect of the present invention is a method for manufacturing a photoelectric conversion device by irradiating a single crystal semiconductor substrate with an ion beam 70% or more of which is a cluster ion of hydrogen, whose mass is heavier than that of a hydrogen molecule to form a damaged layer at a predetermined depth from a surface of the single crystal semiconductor substrate; forming at least a first impurity semiconductor layer having one conductivity type, a first electrode in contact with the first impurity semiconductor layer, and a bonding layer over the first electrode layer on a surface side of the single crystal semiconductor substrate which is irradiated with the ion beam; arranging a plurality of the single crystal semiconductor substrates over one surface of a supporting substrate having an insulating surface with the bonding layer firmly attached to the supporting substrate; separating and removing a part of the single crystal semiconductor substrate by heat treatment using the damaged layer as a boundary while the single crystal semiconductor layer is left over the supporting substrate; forming a second impurity semiconductor layer having an opposite conductivity type to the conductivity type of the first impurity semiconductor layer on a surface side which is exposed by separating the part of the single crystal semiconductor substrate; and irradiating the single crystal semiconductor layer with a laser beam in a nitrogen atmosphere from a side of the second impurity semiconductor layer to process a surface of the second impurity semiconductor layer.

One aspect of the present invention is a method for manufacturing a photoelectric conversion device by irradiating a single crystal semiconductor substrate with an ion beam 70% or more of which is a cluster ion of hydrogen, whose mass is heavier than that of a hydrogen molecule to form a damaged layer at a predetermined depth from a surface of the single crystal semiconductor substrate; forming at least a first impurity semiconductor layer having one conductivity type, a first electrode in contact with the first impurity semiconductor layer, and a bonding layer over the first electrode layer on a surface side of the single crystal semiconductor substrate which is irradiated with the ion beam; arranging a plurality of the single crystal semiconductor substrates over one surface of a supporting substrate having an insulating surface with the bonding layer firmly attached to the supporting substrate; separating and removing a part of the single crystal semiconductor substrate by heat treatment using the damaged layer as a boundary while a single crystal semiconductor layer is left over the supporting substrate; irradiating a single crystal semiconductor layer with a laser beam in a nitrogen atmosphere from a surface side which is exposed by separating the part of the single crystal semiconductor substrate; and then forming a second impurity semiconductor layer having an opposite conductivity type to the conductivity type of the first impurity semiconductor layer on a surface side of the single crystal semiconductor substrate irradiated with the laser beam.

Note that single crystals are crystals in which crystal faces and crystallographic axes are aligned and atoms or molecules which consist the single crystals are spatially ordered. However, although single crystals are structured by orderly aligned atoms, single crystals may include a lattice defect in which the alignment is disordered as a part or single crystals may include intended or unintended lattice strain.

The surface of the single crystal semiconductor layer can be planarized by irradiating the surface which is exposed by separating the part of the single crystal semiconductor substrate to melt and re-single-crystallize at least a surface layer of the region irradiated with the laser beam. Furthermore, by performing a laser processing, crystal defects which remain in the single crystal semiconductor layer can be repaired. With the use of the single crystal semiconductor layer which is left over the supporting substrate by separating the part of the single crystal semiconductor substrate as a photovoltaic conversion layer, a photoelectric conversion device which is excellent in photoelectric conversion characteristics can be manufactured.

Furthermore, laser irradiation is performed to process the surface of the single crystal semiconductor layer; and then an impurity semiconductor layer is formed; thus the impurity concentration of the impurity semiconductor layer can be high, and a shallow junction can be formed. Accordingly a photovoltaic conversion device with high collection efficiency of photogenerated carriers can be manufactured.

BRIEF DESCRIPTION OF DRAWINGS

In the accompanying drawings:

FIG. 3A is an enlarged view of a corner portion and FIG. 3B is a cross-sectional shape of a peripheral end portion;

BEST MODE FOR CARRYING OUT THE INVENTION

Embodiment Mode

Figure 1:
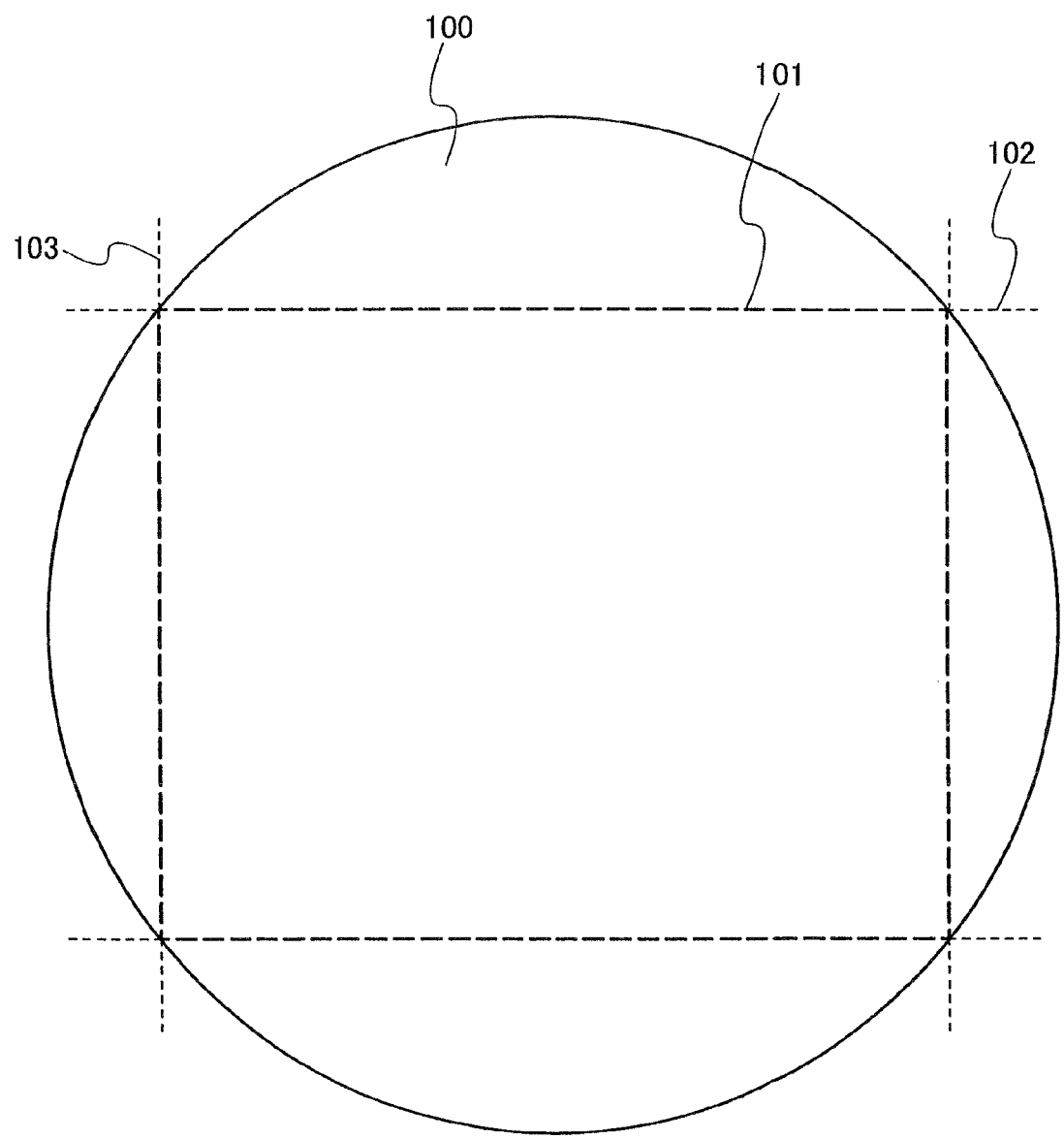
FIG. 1 shows an aspect in which a semiconductor substrate for transfer with a predetermined external dimension is cut out from a circular single crystal semiconductor substrate.

Hereinafter, embodiment modes of the present invention will be described with reference to the accompanying drawings. Note that the present invention is not limited to the description below, and it is easily understood by those skilled in the art that modes and details can be modified in various ways without departing from the purpose and the scope of the present invention. Therefore, the present invention should not be interpreted as being limited to the descriptions of embodiment modes below. In the following structure, the reference numeral indicating the same part will be used in common throughout the drawings.

(Processing 1 of a Single Crystal Semiconductor Substrate)

A photovoltaic conversion device according to the present invention is formed using a semiconductor layer which absorbs light energy to generate photoexcited carriers, that is, a photovoltaic conversion layer is formed of a single crystal semiconductor layer, typically, single crystal silicon. The photovoltaic conversion layer is obtained by separating a surface layer part of an ingot or wafer single crystal semiconductor substrate and fixing the surface layer part of the ingot or wafer single crystal semiconductor layer over a substrate having an insulating surface.

FIG. 1 shows an aspect in which a semiconductor substrate for transfer with a predetermined external dimension is cut out from a circular single crystal semiconductor substrate with a certain size for forming a photovoltaic conversion layer. A typical example of a single crystal semiconductor substrate 100 is a single crystal silicon wafer. Alternatively, a polycrystalline silicon wafer can be used. The area of a semiconductor substrate 101 for transfer can be maximized by making a square inscribed in the circumference of the single crystal semiconductor substrate 100. However, the semiconductor substrate 101 for transfer is not necessarily a square. For example, in the case of manufacturing a solar photovoltaic module using a photovoltaic conversion device, the semiconductor substrate 101 for transfer may be formed so that a light receiving area is maximized in accordance with the size of the module. It is to be noted that the size of a silicon wafer is preferably 300 mm or more in diameter, for example, a silicon wafer which is 400 mm in diameter or 450 mm (18 inch) in diameter is preferably used. This is because an area of an opening (non-electricity generation region) which is generated when a plurality of unit cells is arranged can be reduced in the case of manufacturing a solar photovoltaic module.

Figure 2:
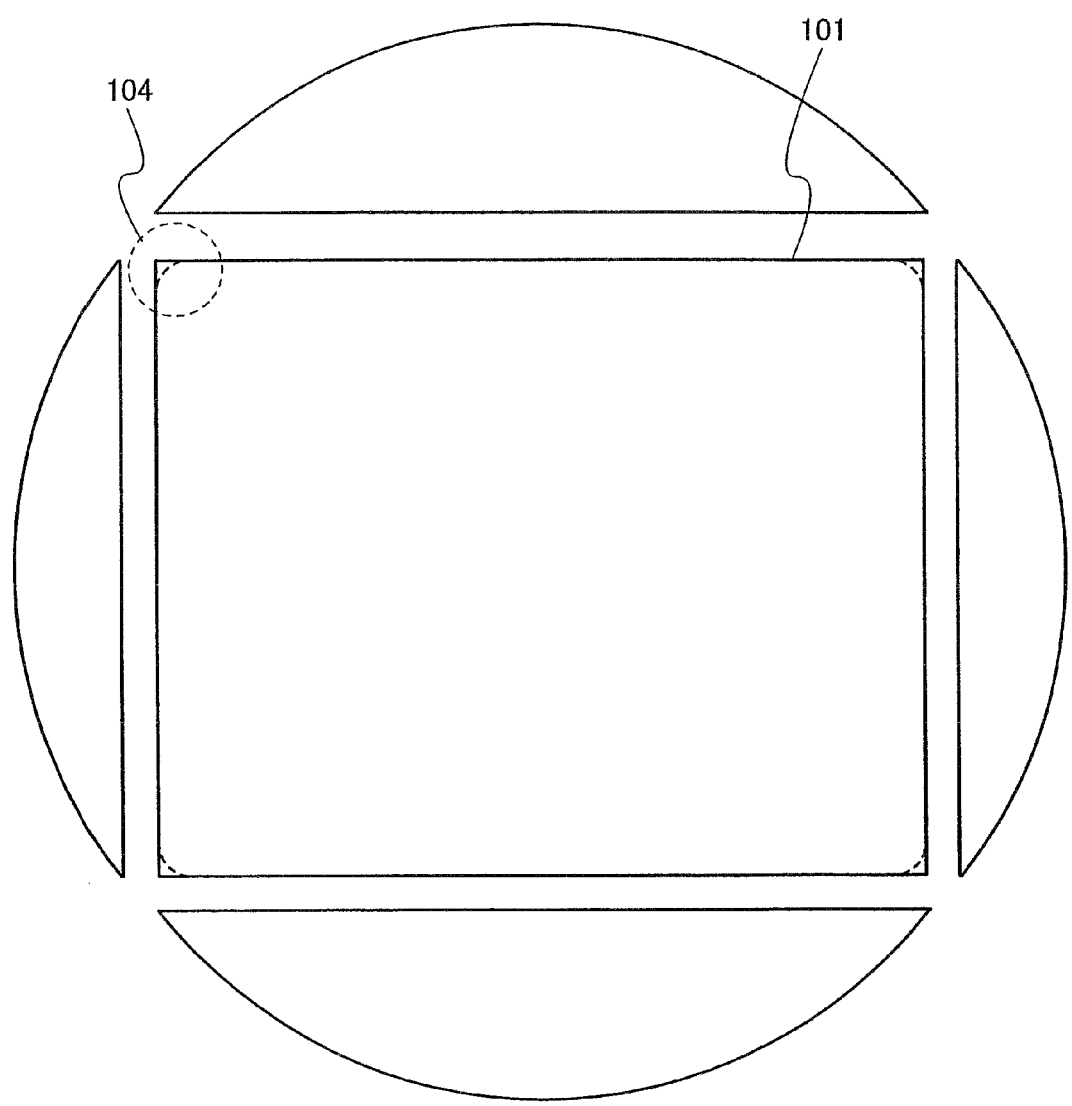
FIG. 2 shows an aspect of a semiconductor substrate for transfer which has been cut out from a circular single crystal semiconductor substrate.

FIG. 2 shows an aspect of a semiconductor substrate for transfer which is cut out from a circular single crystal semiconductor substrate. As shown in FIG. 1, in the case where the semiconductor substrate 101 for transfer is cut out, with its vertexes inscribed in the circumference of the single crystal semiconductor substrate 100, to be a quadrangle along cutoff lines 102 and 103, the degree of a vertex of a corner portion 104 shown in a dashed circle in the figure is substantially 90°. This is the same as in the case where the semiconductor substrate 101 for transfer is cut out from within the single crystal semiconductor substrate 100.

Figure 3A:
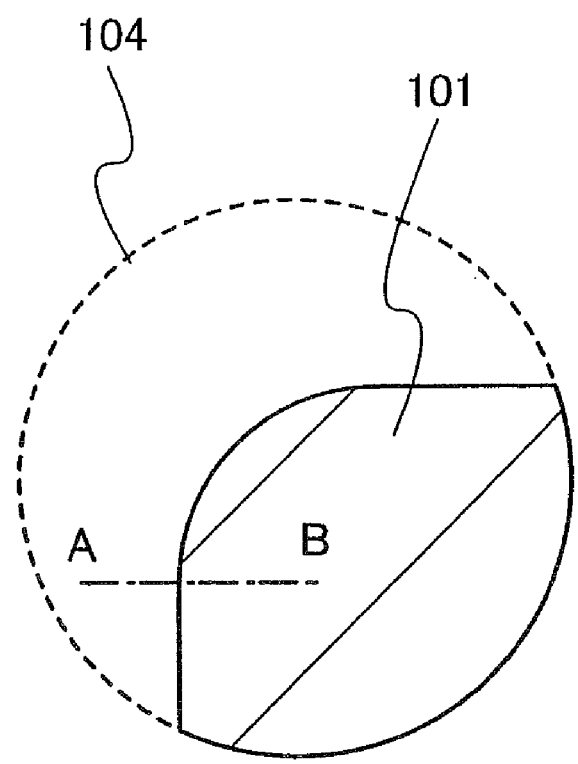
FIGS. 3A and 3B are a structure of a semiconductor substrate for transfer.
Figure 3B:
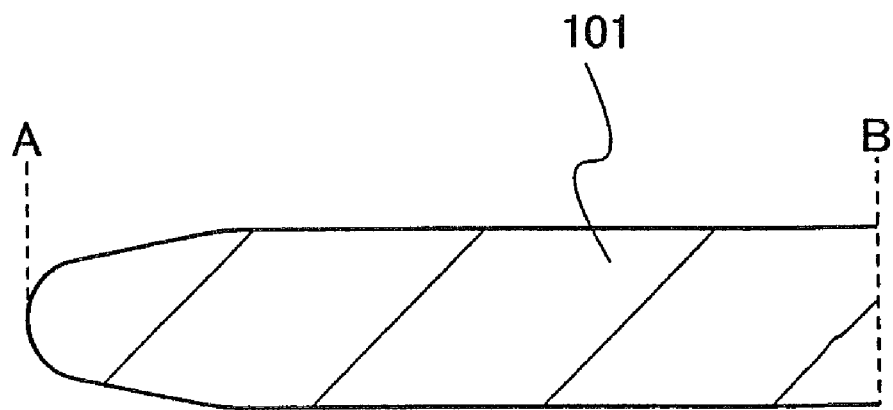

In that case, the corner portion 104 is preferably processed into a curved surface so as not to be a sharp end portion. FIGS. 3A and 3B show a structure of a semiconductor substrate for transfer. FIG. 3A is an enlarged view of the corner portion 104 and such processing into a curved surface can prevent the semiconductor substrate 101 for transfer from being damaged. Further, as shown in FIG. 3B, it is preferable that a peripheral end portion of the semiconductor substrate 101 for transfer be chamfered by shaving a sharp angle so that cross-sectional shape thereof is processed into a shape with a curved surface or a shape with a multi-stage angle. This can reduce waste of silicon resources by preventing damage of the substrate. Note that mill ends after cutting-out can be reused by being melted.

(Processing 2 of a Single Crystal Semiconductor Substrate)

Figure 4:
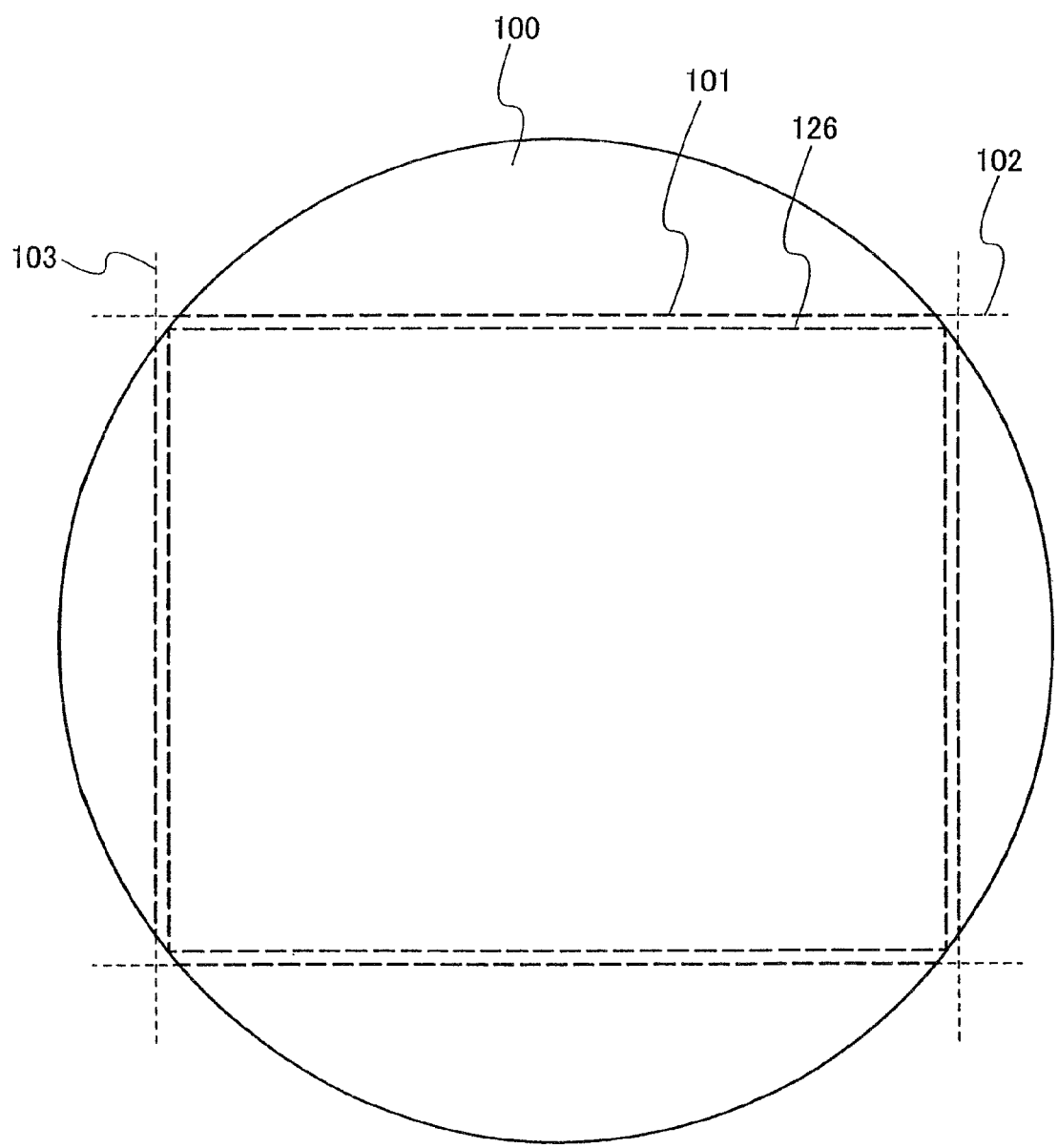
FIG. 4 shows an aspect in which a semiconductor substrate for transfer with a predetermined external dimension is cut out from a circular single crystal semiconductor substrate.

FIG. 4 shows an aspect in which a semiconductor substrate 101 for transfer with a predetermined external dimension is cut out from a circular single crystal semiconductor substrate with a certain size for forming a photovoltaic conversion layer, which differs from that of FIG. 1. A typical example of a single crystal semiconductor substrate 100 is a single crystal silicon wafer. Alternatively, a polycrystalline silicon wafer can be used. The area of a semiconductor substrate 101 for transfer can be maximized by making a square inscribed in the circumference of the single crystal semiconductor substrate 100. However, the semiconductor substrate 101 for transfer is not necessarily a square, which is similar to the case of FIG. 1.

Figure 5:
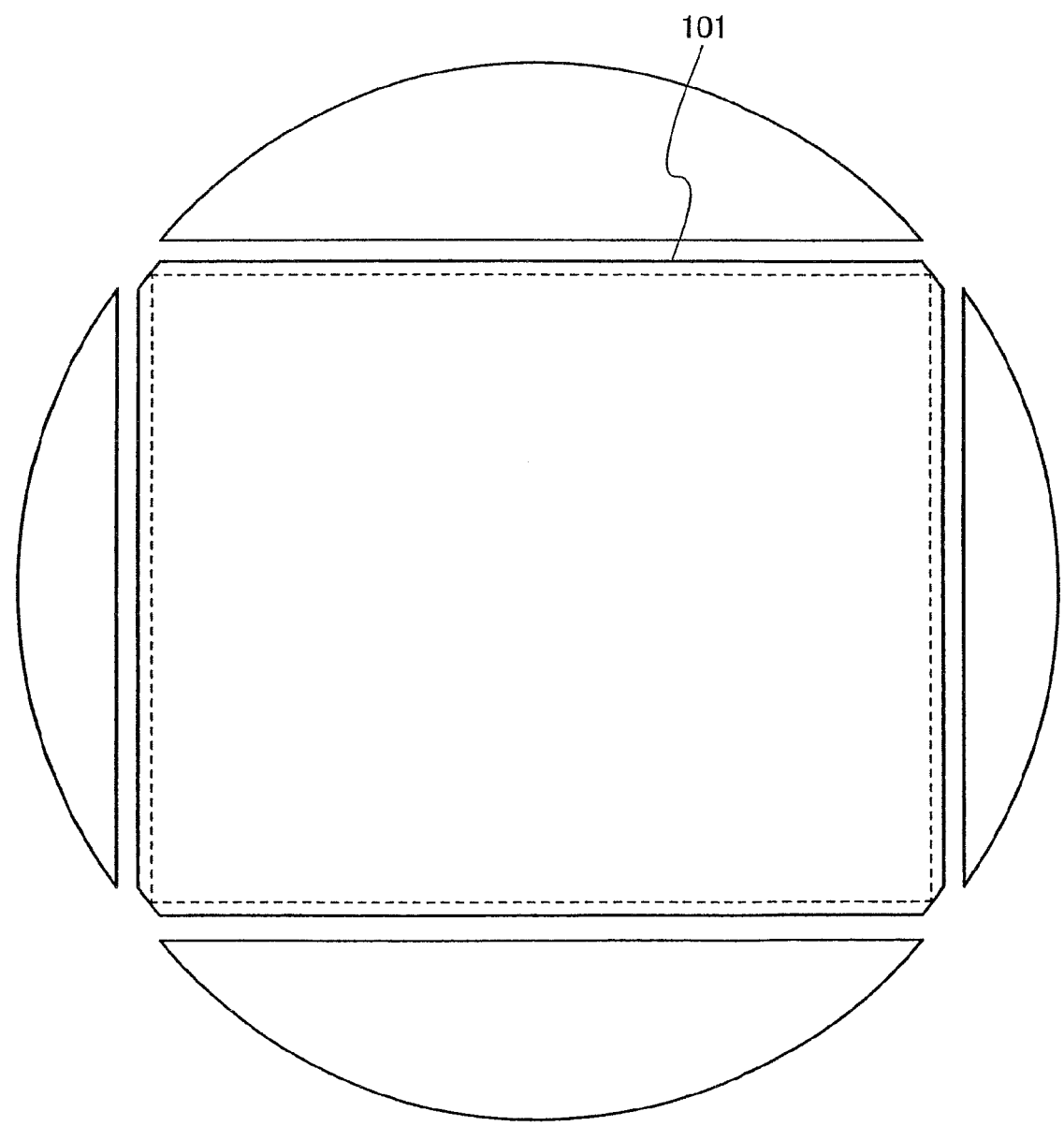
FIG. 5 shows an aspect of a semiconductor substrate for transfer which has been cut out from a circular single crystal semiconductor substrate.

As shown in FIG. 4, the semiconductor substrate 101 for transfer is cut out with the distance between opposite sides longer than that in a rectangular region 126 inscribed in the circumference. That is, the rectangular semiconductor substrate 101 for transfer can be cut out so as not to make a vertex of a rectangle 90° by cutting along cutoff lines 102 and 103. Through such processing, as shown in FIG. 5, an area required for manufacturing a display panel can be secured in the semiconductor substrate 101 for transfer and the substrate whose corner portions are not acute angles or 90° can be manufactured. Since the corner portion of the semiconductor substrate 101 for transfer does not have a right angle, the substrate can be prevented from being damaged when it is handled. Also as described in FIG. 3B, it is preferable that the peripheral end portion of the semiconductor substrate 101 for transfer be chamfered by shaving a sharp angle so that the cross-sectional shape thereof be processed into a shape with a curved surface or a shape with a multi-stage angle. This can reduce waste of silicon resources by preventing damage of the substrate. Note that mill ends after cutting-out can be reused by being melted.

(Arrangement of a Single Crystal Semiconductor Layer)

Figure 6:
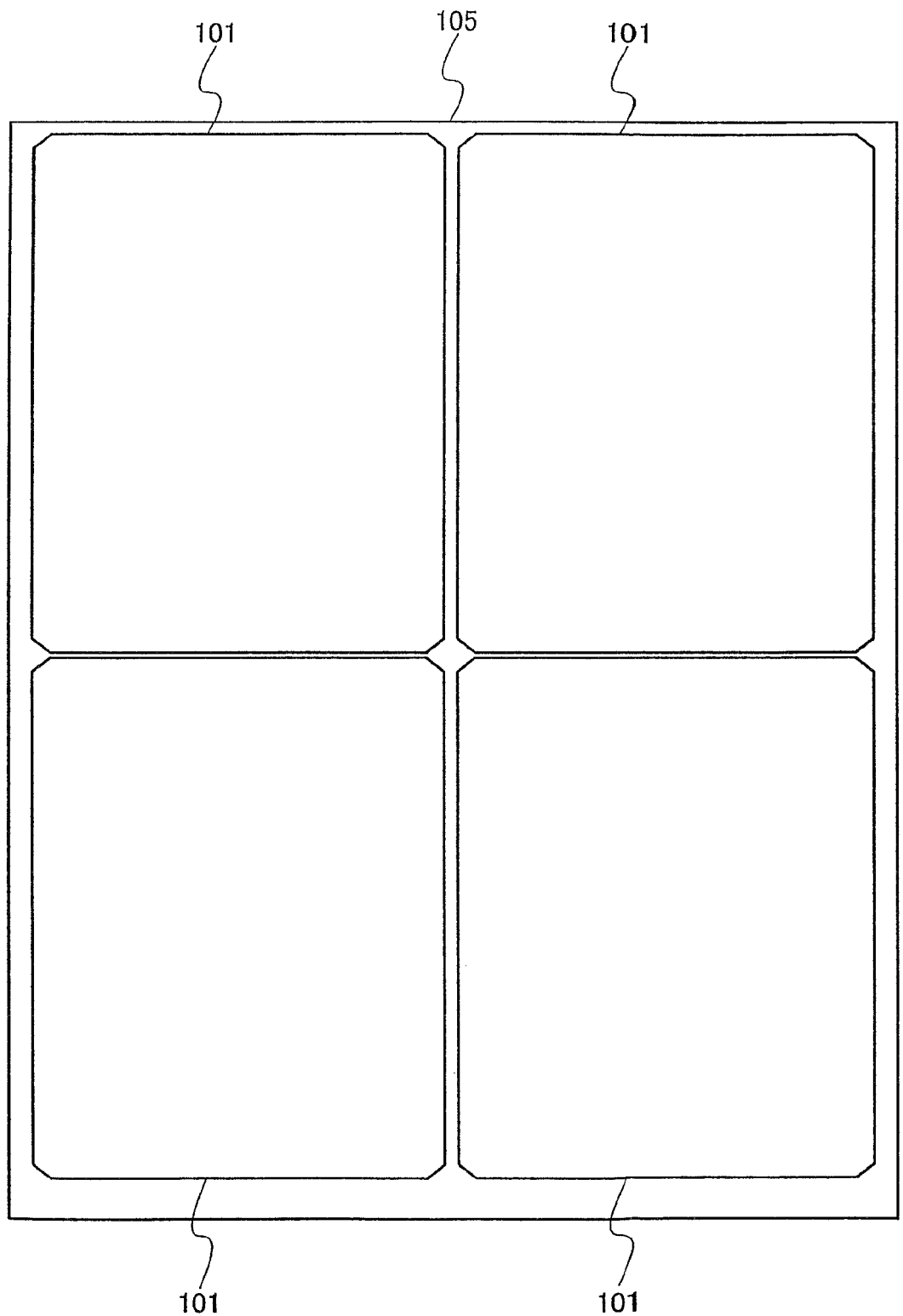
FIG. 6 is a plane view illustrating arrangement of semiconductor substrates for transfer bonded to a supporting substrate.

FIG. 6 shows an example of arrangement when a semiconductor substrate 101 for transfer is bonded to a supporting substrate 105.

As the supporting substrate 105, a heat-resistant insulating substrate such as a glass substrate or a ceramic substrate is preferably used. For example, when a glass substrate is used as the supporting substrate 105, a variety of glass substrates that are used in the electronics industry are used, such as a substrate of aluminosilicate glass, aluminoborosilicate glass, or barium borosilicate glass. As the glass substrate, a glass substrate which can be used for a liquid crystal panel or the like can be employed. As the supporting substrate 105, a rectangular glass substrate which has a side of 500 mm or more can be used. For example, a mother glass substrate such as a 3.5th generation substrate (600 mm×720 mm or 620 mm×750 mm), or a 4th generation substrate (680 mm×880 mm or 730 mm×920 mm) can be used. Alternatively, a mother glass substrate having a large area can be used, such as a 6th generation substrate (1500 mm×1850 mm), a 7th generation substrate (1870 mm×2200 mm), or an 8th generation substrate (2200 mm×2400 mm).

By using a glass substrate having a large area as the supporting substrate 105, a solar photovoltaic module using a photovoltaic conversion device can have a large area, and productivity can be improved. For example, in the case of using a glass substrate having a size of 600 mm×720 mm, a silicon wafer which is 450 mm in diameter is used; thus four semiconductor substrates 101 for transfer each of which has a size of 280 mm×350 mm can be attached. By cutting out the rectangular semiconductor substrate 101 for transfer having the above-mentioned size from the circular silicon wafer, mill ends of the silicon wafer remain; however, the semiconductor substrates 101 for transfer can be densely arranged over the rectangular glass substrate. Moreover, in the case of using a glass substrate having a size of 730 mm×920 mm as the supporting substrate 105, six semiconductor substrates 101 for transfer having a size of 335 mm×300 mm can be attached.

A damaged layer is formed in a region at a depth of less than 10 μm from a surface of the semiconductor substrate 101 for transfer, that is, at a depth of 50 nm or more and less than 10000 nm, preferably, at a depth of from 100 nm to 5000 nm. A single crystal semiconductor layer is separated from the semiconductor substrate 101 for transfer using the damaged layer as a boundary, and formed over the supporting substrate 105. The detail of a process for manufacturing a photovoltaic conversion device using the single crystal semiconductor layer separated from the semiconductor substrate 101 for transfer will be described in the following embodiment modes.

Embodiment Mode 1

In this embodiment mode, a method for manufacturing a photovoltaic conversion device using a solar cell by separating a thin single crystal semiconductor layer from a single crystal semiconductor substrate and transferring the separated single crystal semiconductor layer to a substrate having an insulating surface or an insulating substrate, will be described with reference to the drawings.

Figure 7:
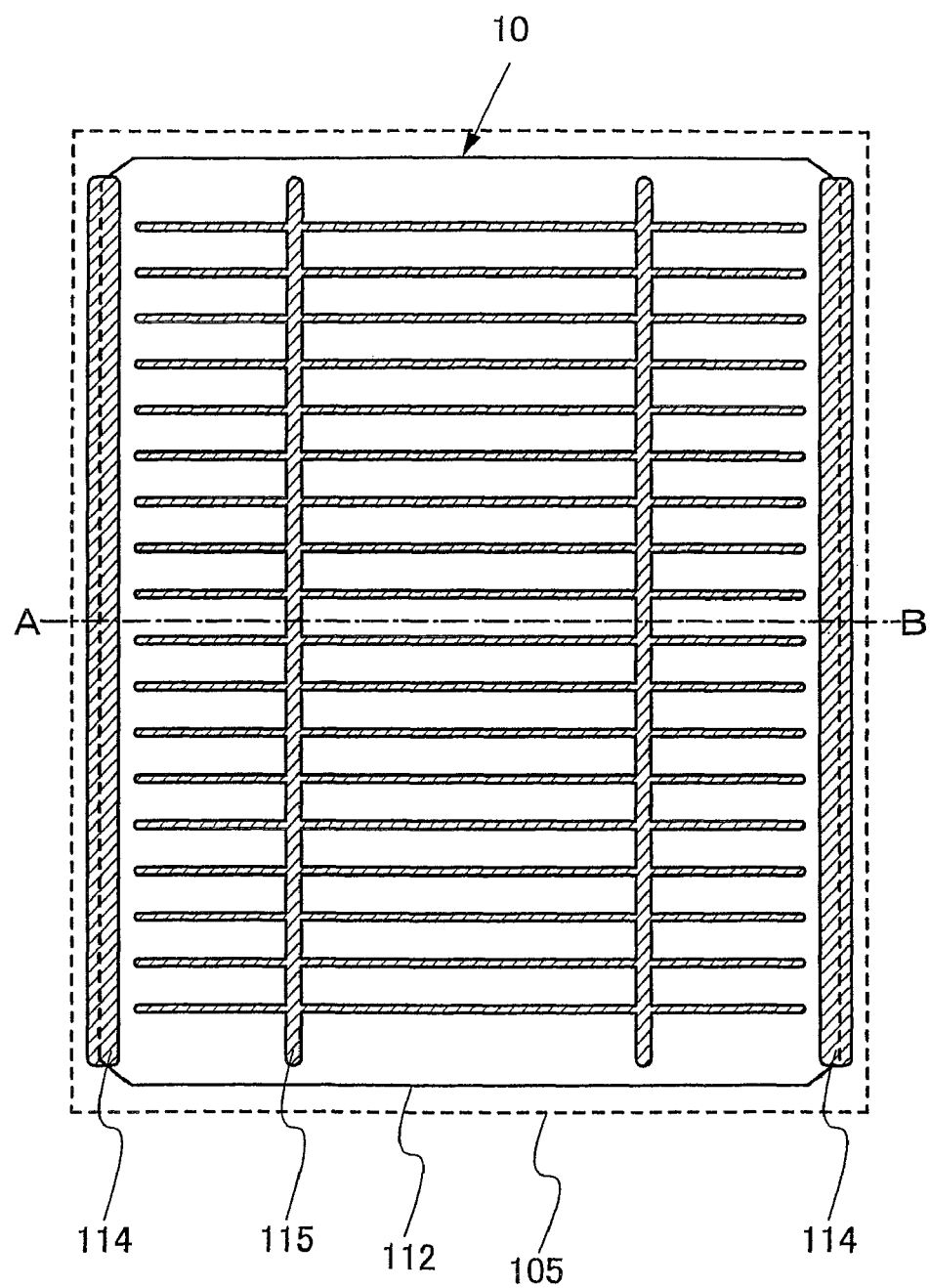
FIG. 7 is a plane view showing a structure of a photoelectric conversion device.

FIG. 7 is a plan view of a photovoltaic conversion device 10 according to this embodiment mode. This photovoltaic conversion device 10 generates electric power when light is incident on a single crystal semiconductor layer 112 provided over a supporting substrate 105. In the single crystal semiconductor layer 112, an impurity semiconductor layer for forming a built-in electric field is formed. As the single crystal semiconductor layer 112, typically, single crystal silicon is used. Further, a polycrystalline semiconductor layer can be used instead of the single crystal semiconductor layer 112. In that case, polycrystalline silicon is used.

In an example of FIG. 7, a net-like shape second electrode 115 is provided on a surface side of the single crystal semiconductor layer 112, and a first electrode (not shown in the plane view) is provided on a rear surface side of the single crystal semiconductor layer 112. An auxiliary electrode 114 is an electrode which is connected to the first electrode provided on the rear surface side of the single crystal semiconductor layer 112. The photovoltaic conversion device 10 of this embodiment mode has a structure in which the single crystal semiconductor layer 112 is bonded to the supporting substrate 105 having an insulating surface, and thus, a structure in which both a positive electrode and a negative electrode are provided on the same surface side of the supporting substrate, is mainly employed.

Next, a manufacturing process of the photovoltaic conversion device 10 will be described with reference to cross-sectional views corresponding to a cutoff line A-B in FIG. 7.

Figure 8A:
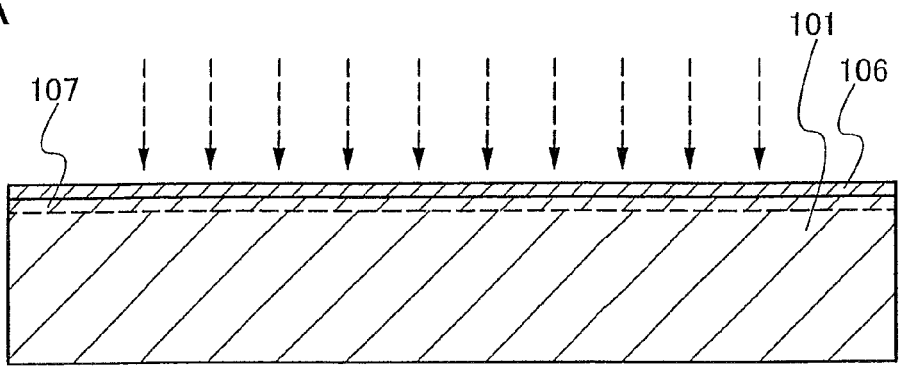
FIGS. 8A to 8D are cross sectional views illustrating a manufacturing process of a photoelectric conversion device.

The semiconductor substrate 101 for transfer shown in FIG. 8A is cut out to be substantially quadrangle from a circular single crystal semiconductor substrate. A typical example of the semiconductor substrate 101 for transfer is single crystal silicon, and single crystal silicon having a mirror-polished surface is preferable. A protective film 106 is preferably formed from a silicon oxide or a silicon nitride, and is formed by a chemical vapor deposition method. When a first impurity semiconductor layer is formed in the semiconductor substrate 101 for transfer, the surface is irradiated with ions and planarity of the surface is deteriorated; therefore, the protective film 106 is preferably provided. The protective film 106 is preferably provided with a thickness of 50 nm to 200 nm.

Then, a first impurity semiconductor layer 107 having one conductivity type is formed in the semiconductor substrate 101 for transfer. For example, boron as an impurity imparting one conductivity type is added to the semiconductor substrate 101 for transfer to form a p-type semiconductor layer as the first impurity semiconductor layer 107. The first impurity semiconductor layer 107 is disposed on the side opposite to the light incidence side to form a back surface field (BSF).

The addition of boron is performed using an ion doping apparatus in which a substrate is irradiated with generated ion flow that is generated from source gases of $B_2H_6$ and $BF_3$ and accelerated by an electric field, without mass separation. Addition of the ions into the first impurity semiconductor layer 107 through the protective film 106 can prevent damage to the surface due to ion irradiation.

Figure 8B:
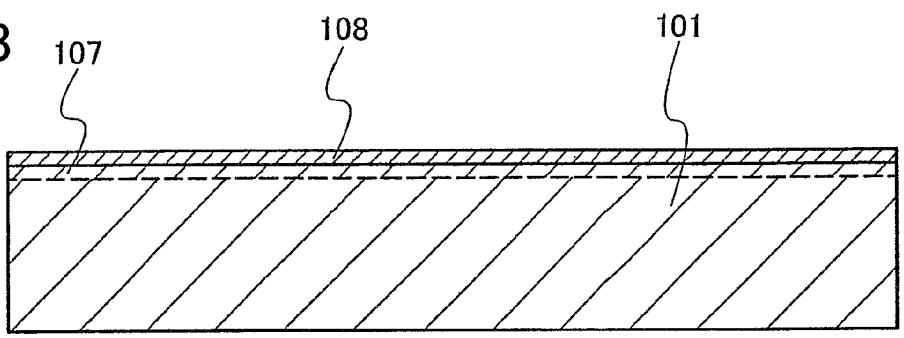

In FIG. 8B, the protective film 106 is removed and a first electrode 108 is provided over the first impurity semiconductor layer 107. The first electrode 108 is preferably formed of heat-resistant metal. As the heat-resistant metal, a metal material such as titanium, molybdenum, tungsten, or chromium is preferably used. Further, nitride of any of these metal materials may be formed to be in contact with the first impurity semiconductor layer 107 so that the first electrode layer 108 has a two-layer structure of a layer formed of nitride of any of the metal materials and a layer formed of the heat-resistant metal. By provision of the layer formed of nitride of any of the metal materials, adhesion of the first electrode 108 and the first impurity semiconductor layer 107 can be increased. The first electrode 108 is formed by a vacuum deposition method or a sputtering method.

Figure 8C:
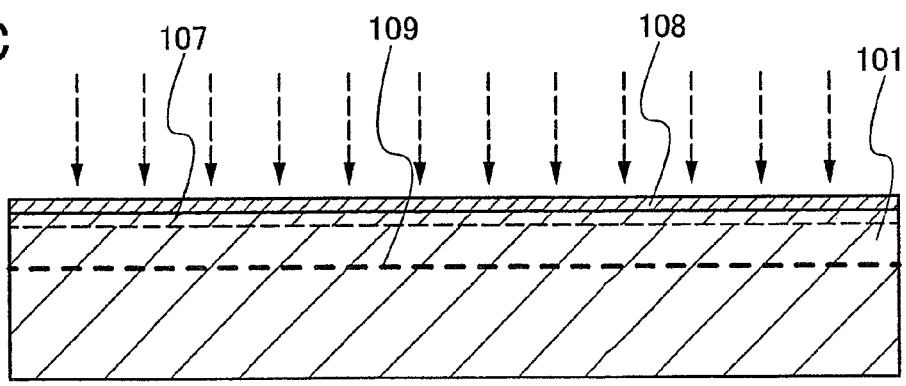

FIG. 8C shows a step in which the semiconductor substrate 101 for transfer is irradiated with an ion beam containing hydrogen ions from the surface over which the first electrode 108 is formed so as to form a damaged layer 109. The damaged layer 109 is formed at a certain depth from a surface by introducing cluster ions typified by hydrogen ions, preferably, $H_3^+$, whose mass is heavier than that of hydrogen molecules. The depth at which the damaged layer 109 is formed is controlled by acceleration energy of ions. Depending on the depth at which the damaged layer 109 is formed, the thickness of the single crystal semiconductor layer is determined; therefore, electric field strength for accelerating the cluster ions is determined in consideration of the thickness of the single crystal semiconductor layer. It is preferable that the damaged layer 109 be formed at a depth of less than 10 μm, that is, at a depth of 50 nm or more and less than 10000 nm, preferably, from 100 nm to 5000 nm from the surface of the semiconductor substrate 101 for transfer. Furthermore, by introducing the cluster ions into the semiconductor substrate 101 for transfer through the first electrode 108, the damage to the surface of the semiconductor substrate 101 for transfer due to ion irradiation can be prevented. The cluster ions of hydrogen are introduced through the first impurity semiconductor layer 107 to form the damaged layer 109, thus the introduction can also serve as hydrogenation of the first impurity semiconductor layer 107.

The cluster ions which are hydrogen ions typified by $H_3^+$ generate hydrogen plasma. The damaged layer 109 can be formed using an ion doping apparatus in which the semiconductor substrate 101 for transfer is irradiated with ions which are generated in the hydrogen plasma and accelerated by an electric field, without mass separation. With the use of the ion doping apparatus, the damaged layer 109 can be easily formed even if the semiconductor substrate 101 for transfer has a large area.

Figure 13:
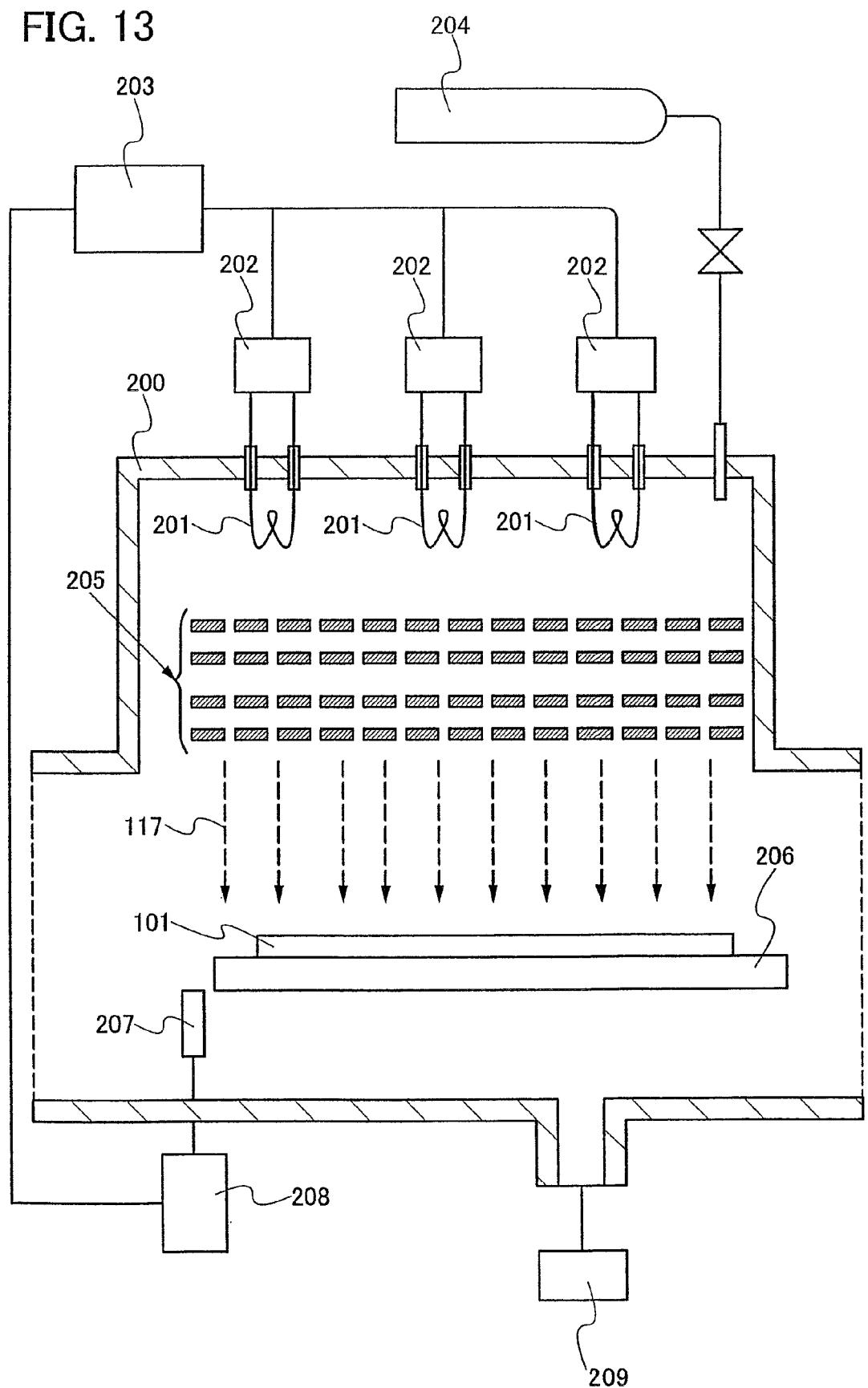
FIG. 13 is a schematic view illustrating a structure of an ion doping apparatus.

FIG. 13 is a schematic view illustrating a structure of an ion doping apparatus in which the semiconductor substrate 101 for transfer is irradiated with a plurality of ions generated in an ion source 200, without mass separation. A predetermined gas such as hydrogen is supplied to the ion source 200 from a gas supply portion 204. The ion source 200 is provided with filaments 201. Filament power sources 202 apply arc discharge voltage to the filaments 201 and adjust current which flows through the filaments 201. A gas supplied from the gas supply portion 204 is exhausted through an exhaust system 209.

Ions generated in the ion source 200 are drawn by a drawing electrode system 205 and an ion beam 117 is formed. The semiconductor substrate 101 for transfer, which is placed on a mounting board 206, is irradiated with the ion beam 117. The proportion of ions contained in the ion beam 117 is measured by a mass analysis tube 207 which is provided near the mounting board 206. Ion density measured by the mass analysis tube 207 is converted into a signal by a mass analyzer 208 and a result thereof may be fed back to a power source controller 203. The power source controller 203 can control the filament power sources 202 in accordance with the result of the measured ion density.

As shown in FIG. 13, a gas such as hydrogen, supplied from the gas supply portion 204 flows in a chamber of the ion doping apparatus, and is exhausted through the exhaust system 209.

This is apparent from the result of ion mass spectrometry of the ion beam 117 which flows to mounting board 206 using the mass analysis tube 207, and the proportion of $H_3^+$ to the total amount of $H^+$, $H_2^+$, and $H_3^+$ of hydrogen ions is 70% or more. Accordingly, by irradiating the semiconductor substrate 101 for transfer with the ion beam 117 containing $H_3^+$ ions of cluster ions produced in a large amount, the implantation efficiency of hydrogen becomes higher than that in the case of irradiating $H^+$, and $H_2^+$, so that such a significant effect that hydrogen can be implanted into the semiconductor substrate 101 for transfer at a high concentration even if a dosage is small can be obtained.

By increasing the proportion of $H_3^+$, hydrogen of $1 \times 10^{20}$ atoms/cm$^3$ or more can be contained in the damaged layer 109. In the damaged layer 109 formed in the semiconductor substrate 101 for transfer, a crystal structure is impaired and microvoids are formed, thus the damaged layer 109 has a porous structure. Therefore, the volume of microvoids formed in the damaged layer 109 is changed by heat treatment at a relatively low temperature (600° C. or less), and the single crystal semiconductor layer which is separated along the damaged layer 109 can be obtained.

It is not be noted that a linear ion beam which is longer than the length of a side of the semiconductor substrate 101 for transfer formed in substantially quadrangle is scanned to irradiate the surface of the semiconductor substrate 101 for transfer, and cluster ions are introduced into the semiconductor substrate 101 for transfer, whereby the damaged layer 109 at a uniform depth, can be formed.

Figure 8D:
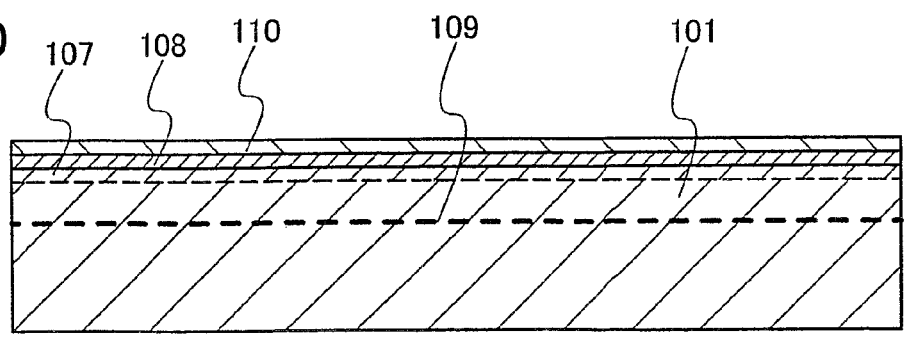

FIG. 8D shows a step in which a bonding layer 110 is formed over the first electrode layer 108. The bonding layer 110 is formed of an insulating film such as a silicon oxide film, a silicon oxynitride film, a silicon nitride oxide film, or a silicon nitride film. The material of the bonding layer 110 is not limited as long as an insulating film can be formed from the material. The bonding layer 110 may be formed of a film whose surface is smooth and has a hydrophilic property. It is preferable that the bonding layer 110 have a surface with an average surface roughness (Ra) of 1 nm or less, preferably, 0.5 nm or less. Note that the average surface roughness (Ra) means an average surface roughness obtained by three-dimensionally expansion of a centerline average roughness that is defined by JIS B0601 so as to be able to apply the Ra to a measurement surface.

As the insulating film which forms smooth and hydrophilic surface, a silicon oxide film containing hydrogen, a silicon nitride film containing hydrogen, a silicon nitride film containing oxygen and hydrogen, a silicon oxynitride film, a silicon nitride oxide film, or the like can be used.

Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that includes more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

As the silicon oxide film containing hydrogen, for example, a silicon oxide film formed of organosilane by a chemical vapor deposition method can be preferably used. This is because the silicon oxide film formed of organosilane as the bonding layer 110 can enhance bonding between the supporting substrate and the single crystal semiconductor layer which is transferred. Examples of organosilane that can be used include silicon-containing compounds such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$).

The silicon nitride film containing hydrogen can be formed using a silane gas and an ammonia gas by a plasma CVD method. Hydrogen may be added to the gases. The silicon nitride film containing oxygen and hydrogen can be formed using a silane gas, an ammonia gas, and a nitrous oxide gas by a plasma CVD method. In either case, an insulating film such as a film of silicon oxide, silicon oxynitride, or silicon nitride oxide, which contains hydrogen, and is formed using a silane gas or the like as a source gas by a chemical vapor deposition method such as a plasma CVD method, a low pressure CVD method, or an atmosphere pressure CVD method can be employed. It is recommended to form the bonding layer 110 at a temperature of 350° C. or less which is low enough to keep hydrogen from being released from the damaged layer 109 formed in the single crystal semiconductor substrate.

Figure 9A:
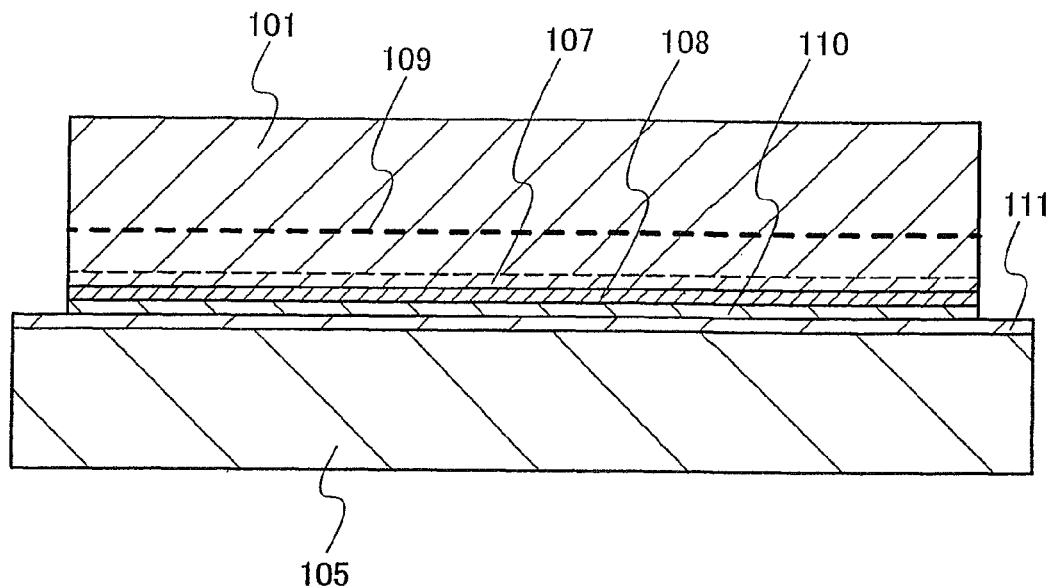
FIGS. 9A and 9B are cross sectional views illustrating a manufacturing process of a photoelectric conversion device.

FIG. 9A illustrates a step in which the supporting substrate 105 is bonded to the semiconductor substrate 101 for transfer. The bonding layer 110 whose surface is smooth and has a hydrophilic property is closely attached to the supporting substrate to be bonded. Hydrogen bond and Van del Waals force act on this bonding. When the surface of the bonding layer 110 has a hydrophilic property, hydroxyl groups or water molecules serve as an adhesive agent, and the water molecules are diffused by heat treatment to be performed later, whereby remaining components form a silanol group (Si—OH), and the silanol group acts to form a bond by hydrogen bonding. Further, this bonding by hydrogen bonding comes to have a covalent bond due to loss of hydrogen and formation of a siloxane bond (O—Si—O). Accordingly, the bond between the semiconductor substrate 101 for transfer and the supporting substrate 105 is enhanced. Note that a silicon nitride film, a silicon nitride oxide film, or the like may be formed as a barrier layer 111 on a bonding surface of the supporting substrate 105. The formation of the barrier layer 111 can prevent impurity contamination from the supporting substrate 105.

In order to favorably perform bonding between the supporting substrate 105 and the bonding layer 110, a bonding surface is preferably activated. For example, one or both of the surfaces which are to form a bond are irradiated with an atom beam or an ion beam. When an atom beam or an ion beam is used, a neutral atom beam of an inert gas of argon or the like or an ion beam of an inert gas can be used. It is also possible to activate the bonding surface by plasma irradiation or radical treatment. Such surface treatment facilitates formation of a bond between different kinds of materials even if a temperature of the heat treatment to be performed later is 400° C. or less.

Figure 9B:
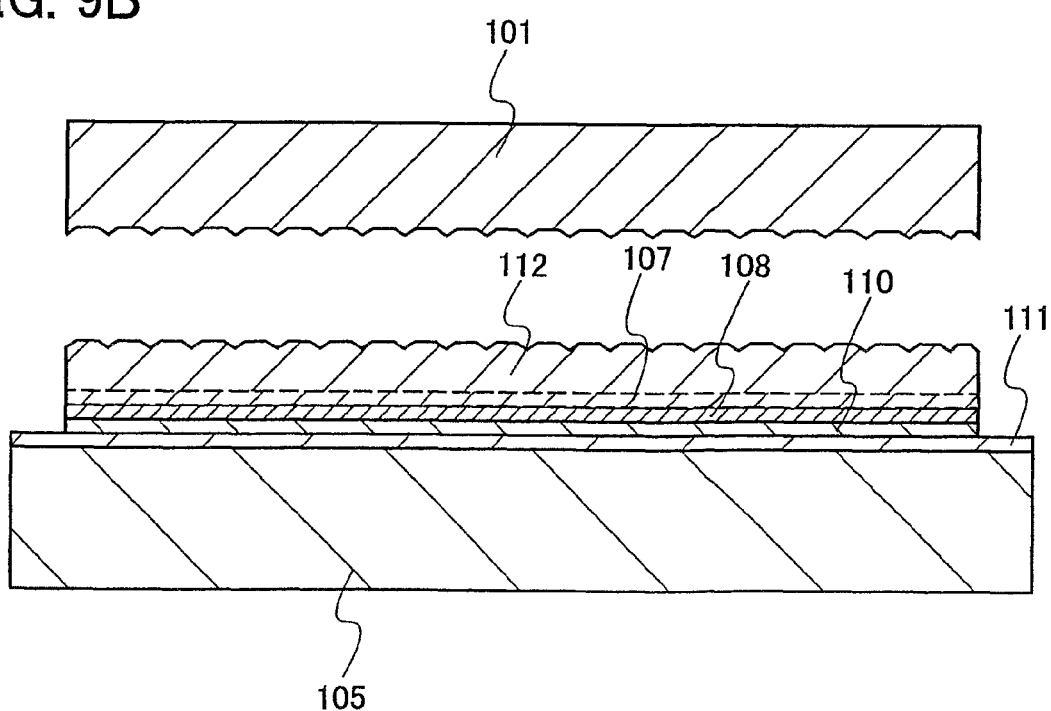

FIG. 9B illustrates a step in which a surface layer part of the semiconductor substrate 101 for transfer is separated by the heat treatment using the damaged layer 109 as a boundary and transferred to the supporting substrate 105. The heat treatment is preferably performed at a temperature equal to or higher than a film formation temperature of the bonding layer 110 and equal to or lower than a heat resistant temperature of the supporting substrate 105. For example, the volume of microvoids formed in the damaged layer 109 is changed by heat treatment at 400° C. to 600° C., and the single crystal semiconductor layer 112 is separated along the legion. Because the bonding layer 110 and the supporting substrate 105 are bonded to each other, the single crystal semiconductor layer 112 and the first electrode 108 remain over the supporting substrate 105. At this time, the single crystal semiconductor layer 112 is formed with a film thickness of 50 nm or more and less than 10000 nm, preferably 100 nm to 5000 nm, almost corresponding to the depth at which the damaged layer is formed.

According to the aforementioned steps, the single crystal semiconductor layer 112 which is fixed over the supporting substrate 105 using the bonding layer 110 can be provided. The surface from which the single crystal semiconductor layer 112 has been separated has values of average surface roughness (Ra): 7 nm to 10 nm, and maximum peak-to-valley height (P-V): 300 nm to 400 nm. Note that the peak-to-valley height (P-V) in this embodiment mode represents a difference between the height of the highest peak and the height of the lowest valley. The peak and the valley in this embodiment refer to a peak and a valley obtained by three-dimensional expansion of the "peak" and the "valley" defined by JISB0601. The peak is represented by the highest part of the peaks in the specified surface. The valley is represented by the lowest part of the valleys in the specified surface. Moreover, a crystal defect is formed in the single crystal semiconductor layer 112 by ions which are introduced to form the damaged layer 109.

Figure 10:
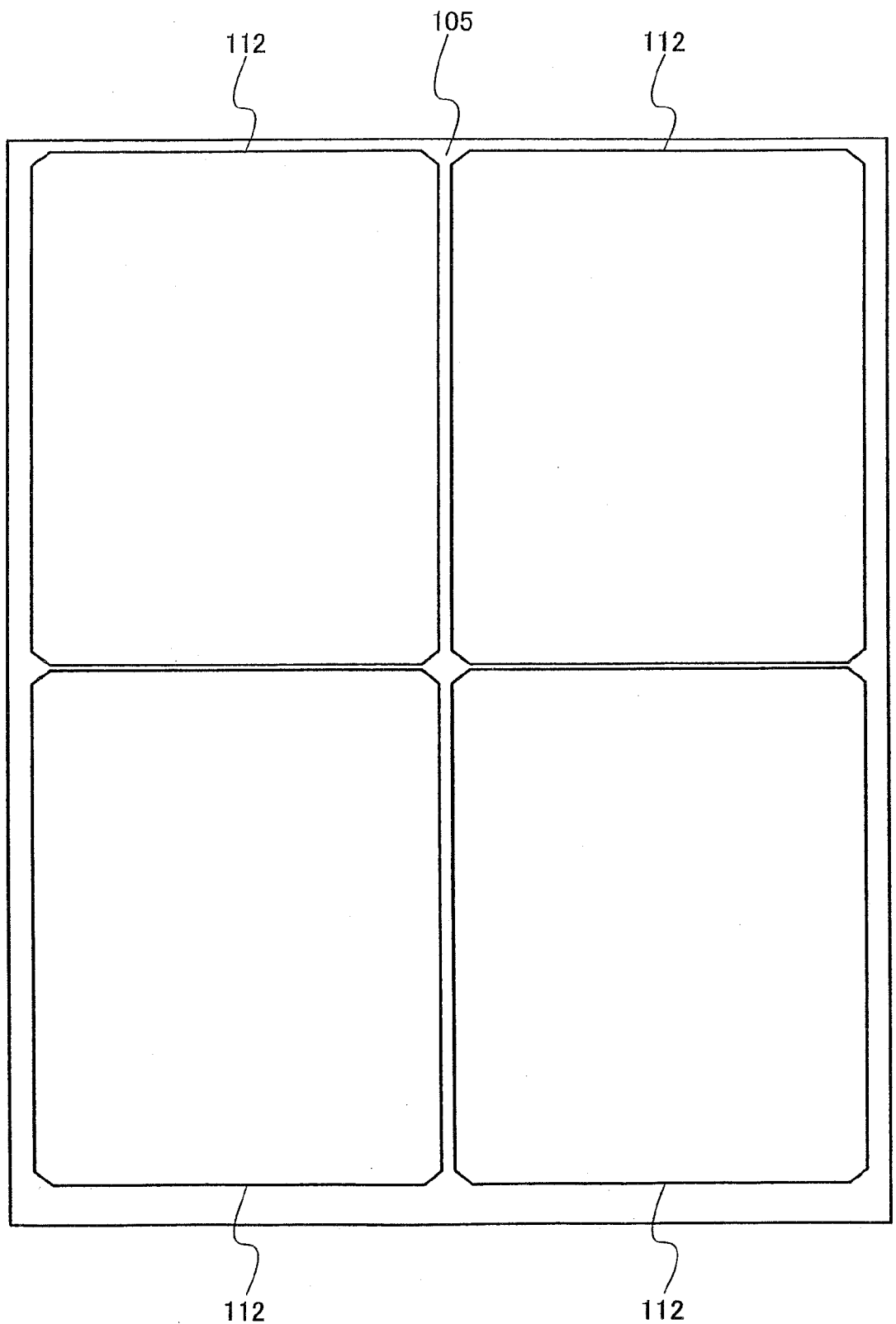
FIG. 10 is a plane view illustrating arrangement of single crystal semiconductor layers over a supporting substrate.

Note that as shown in FIG. 10, a plurality of the single crystal semiconductor layers 112 can be bonded the supporting substrate 105 at a time. For example, four semiconductor substrates for transfer each of which has a size of 280 mm×350 mm can be attached to the supporting substrate 105 of 600 mm×720 mm.

Figure 11A:
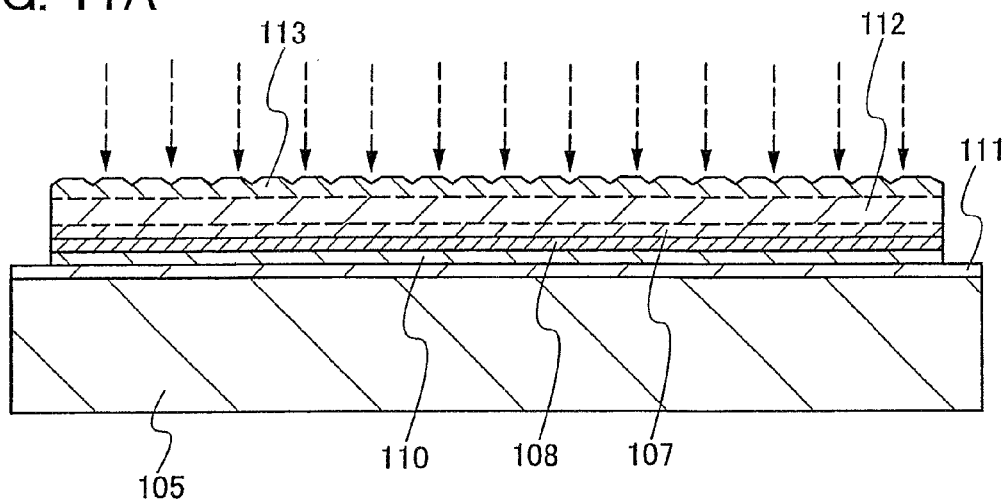
FIGS. 11A to 11C are cross sectional views illustrating a manufacturing process of a photoelectric conversion device.

In FIG. 11A, an impurity imparting an opposite conductivity type to that of the first impurity semiconductor layer 107 is added to the single crystal semiconductor layer 112, whereby a second impurity semiconductor layer 113 is formed. For example, phosphorus or arsenic is added so that an n-type semiconductor layer is formed as the second impurity semiconductor layer 113.

Note that the surface of the single crystal semiconductor layer 112 is closest to the damaged layer 109 or includes a part of the damaged layer 109; therefore, the surface layer of the single crystal semiconductor layer 112 is preferably removed by etching before laser processing to be performed later. As etching, dry etching or wet etching may be performed.

Figure 11B:
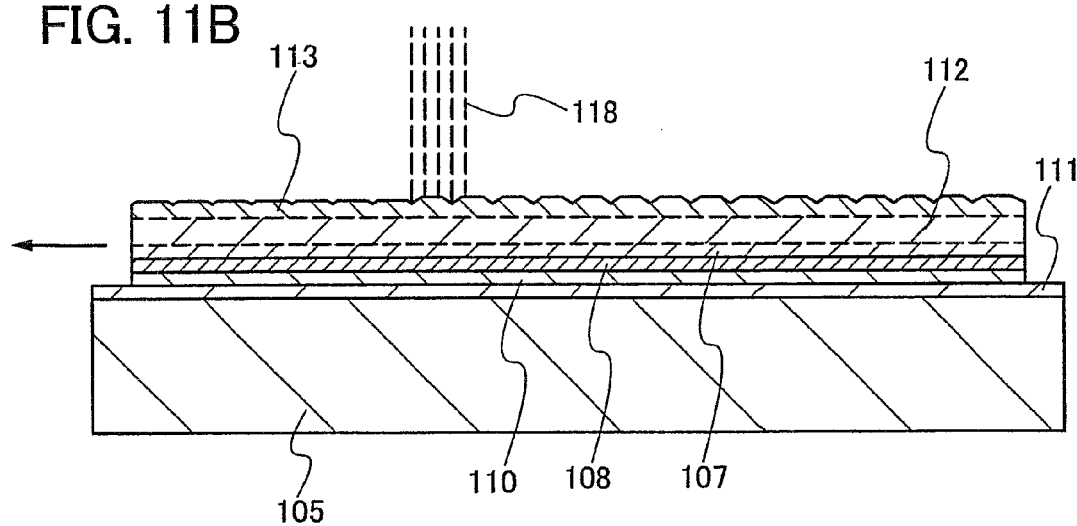

FIG. 11B shows a step in which laser processing is performed to repair crystal defects which remain in the single crystal semiconductor layer 112. By irradiation of the single crystal semiconductor layer 112 with a laser beam 118, at least the surface side of the single crystal semiconductor layer 112 (the surface layer of the single crystal semiconductor layer 112) melts to be re-single-crystallized using the solid-state lower layer portion as a seed crystal in a later cooling process. In that process, the surface of the single crystal semiconductor layer 112 is planarized, so that the single crystal semiconductor layer 112a can be obtained. By laser processing the second impurity semiconductor layer 113, the second impurity semiconductor layer 113a in which an impurity element is distributed at a high concentration in a region on a surface side of the second impurity semiconductor layer 113 can be obtained. In this laser processing, at least a region irradiated with the laser beam is preferably heated at a temperature from 250° C. to 600° C. By heating the region to be irradiated, melting time by laser beam irradiation can be lengthened; thus the crystal defects can be effectively repaired. The irradiation with the laser beam 118 melts the surface side of the single crystal semiconductor layer 112 but the supporting substrate 105 is hardly heated. Therefore, a substrate with low heat resistance, such as a glass substrate can be used as the supporting substrate 105. Further, because the first electrode 108 is formed of heat-resistant metal, the first electrode 108 does not adversely affect the single crystal semiconductor layer 112 when it is heated at the above-mentioned temperature. A silicide is formed at an interface between the first electrode 108 and the first impurity semiconductor layer 107; thus current flows easily. This laser processing serves as activation of the second impurity semiconductor layer 113.

An example of a laser processing apparatus for performing this laser processing will be described with reference to FIG. 14. The laser processing apparatus includes a laser oscillator 210, an optical system 211 that condenses and extends laser light into a linear beam with a narrow cross-section, a gas jetting pipe 212 that controls the atmosphere of a region to be irradiated with a laser beam, a gas supply portion 213 that supplies a gas for controlling the atmosphere to the gas jetting pipe 212, a flow rate control portion 214, a gas heating portion 215, a substrate stage 222 that floats and carries the supporting substrate 105, a guide rail 223 that supports both ends of a substrate and carries it, and a gas supply portion 216 that supplies a gas for floating to the substrate stage 222.

As the laser oscillator 210, the one that oscillates light with wavelength in a range from ultraviolet to visible light is selected. The laser oscillator 210 preferably oscillates a pulsed ArF, KrF, or XeCl excimer laser, or a solid-state laser such as an Nd:YAG laser or YLF laser, whose repetition rate is 1 MHz or less and pulse width is 10 nsec to 500 nsec. For example, an XeCl excimer laser with a repetition rate of 10 Hz to 300 Hz, a pulse width of 25 nsec, and a wavelength of 308 nm is used.

The optical system 211 condenses and extends laser light to form a laser beam a surface irradiated with which has a linear shape in cross-section. The optical system 211 that forms a linear laser beam includes a cylinder lens array 217, a cylinder lens 218, a mirror 219, and a tablet cylinder lens 220. The linear laser beam of approximately 100 mm to 700 mm in a longer direction and approximately 100 μm to 500 μm in a shorter direction can be formed although it depends on the size of a lens.

The supporting substrate 105 is irradiated with the laser beam condensed and extended into a linear shape through a light introduce window 221 of the gas jetting pipe 212. The gas jetting pipe 212 is provided in vicinity to the supporting substrate 105. A nitrogen gas is supplied to the gas jetting pipe 212 from the gas supply portion 213. The nitrogen gas is jetted from an opening portion of the gas jetting pipe 212, which faces the supporting substrate 105. The opening portion of the gas jetting pipe 212 is provided in accordance with an optical axis of the linear laser beam 118 so that the supporting substrate 105 is irradiated with the laser beam is transmitted through the light introduce window 221. Due to the nitrogen gas jetted from the opening portion of the gas jetting pipe 212, a region to be irradiated with the laser beam comes to have a nitrogen atmosphere.

The temperature of a surface of the supporting substrate 105, which is to be irradiated with the laser beam, can be controlled with the nitrogen gas which is supplied to the gas jetting pipe 212 and heated up to 250° C. to 600° C. in the gas heating portion 215. By heating the region to be irradiated, melting time by laser beam irradiation can be controlled as described above.

Air or nitrogen is supplied to the substrate stage 222 from the gas supply portion 216 through the flow rate control portion 214. A gas supplied from the gas supply portion 216 is jetted from the main surface of a substrate stage 222 so that a bottom surface of the supporting substrate 105 is sprayed with the gas, whereby the supporting substrate 105 is floated. The supporting substrate 105 is carried with its both ends mounted on a slider 224 which moves on the guide rail 223. Since the supporting substrate 105 is sprayed with the gas from the substrate stage 222 side, the supporting substrate 105 can be carried without being curved while it is floated. In the laser processing apparatus of this embodiment mode, the nitrogen gas is jetted from the gas jetting pipe 212 to a top surface of the supporting substrate 105, and the bottom surface of the supporting substrate is sprayed with the gas; therefore, the supporting substrate 105 can be prevented from being bent. The substrate stage 222 with such a structure is effective for processing a glass substrate of more than 500 mm on a side and 1 mm or less in thickness. For example, a 600 mm×720 mm or 730×920 mm glass substrate with a thickness of 0.7 mm or less can be processed.

The substrate stage 222 can be divided into vicinity of a laser irradiation portion and the other region. The vicinity of the laser irradiation portion of the substrate stage 222 can be sprayed with a nitrogen gas heated by the gas heating portion 215, so that the supporting substrate 105 can be heated.

Figure 15:
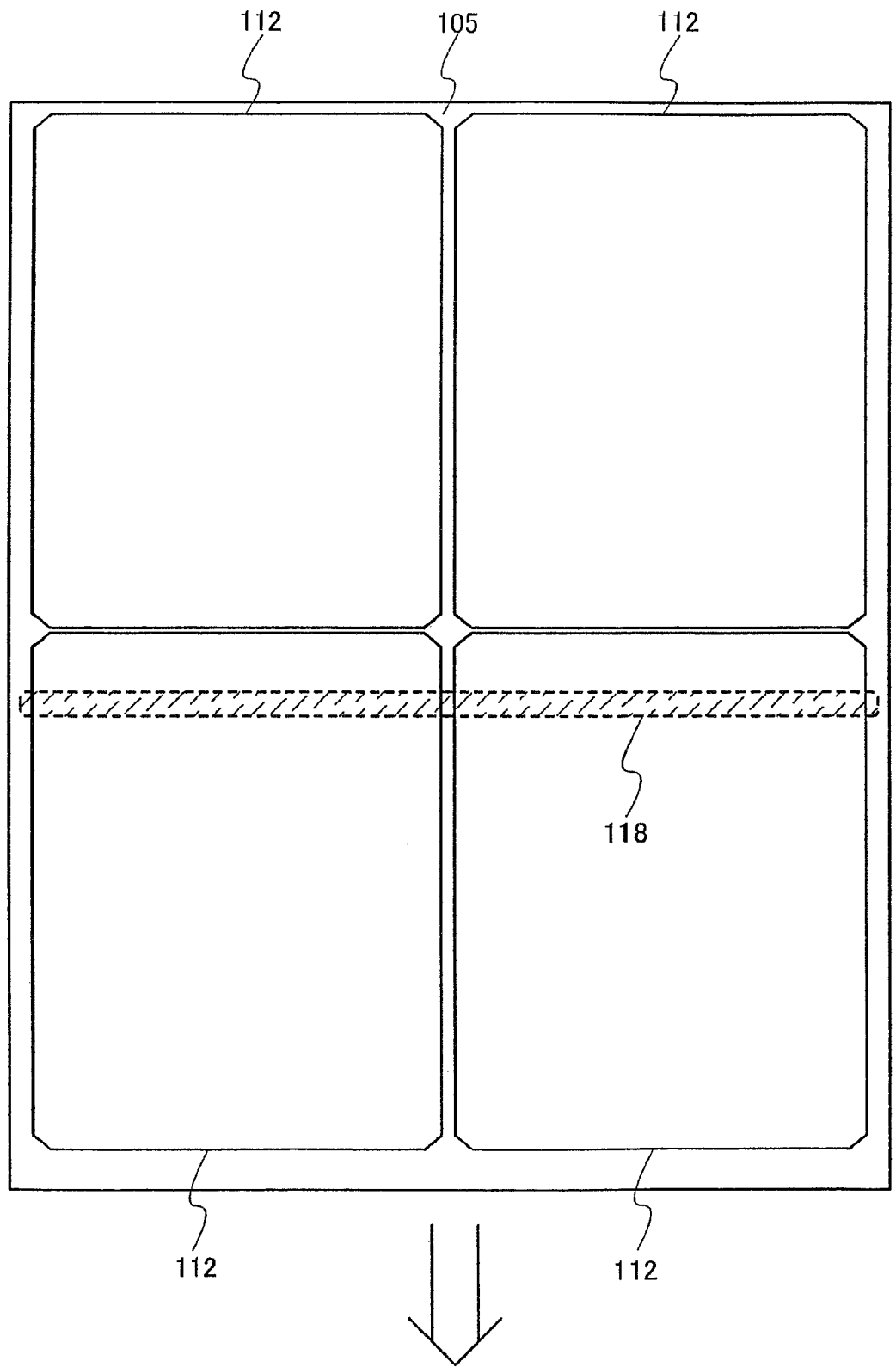
FIG. 15 is a plane view illustrating an aspect in which laser processing is performed on a single crystal semiconductor layer over a supporting substrate.

FIG. 15 shows an aspect in which laser processing is performed with such a laser processing apparatus on the single crystal semiconductor layer 112 over the supporting substrate 105. A plurality of the single crystal semiconductor layers 112 is bonded to the supporting substrate 105, whereby the entire surface of the plurality of the single crystal semiconductor layers 112 can be irradiated with the laser beam 118 condensed and extended in a linear shape by moving the supporting substrate 105.

Figure 11C:
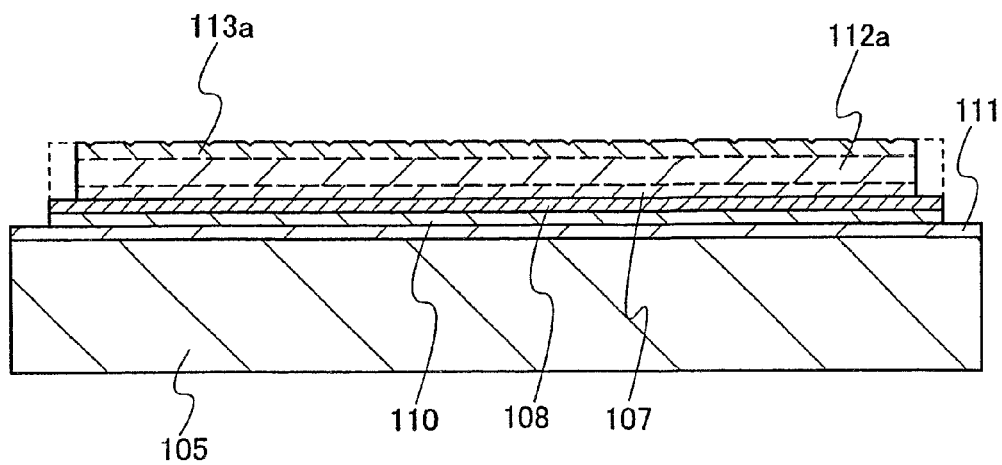

FIG. 11C shows a step in which the end portions of the single crystal semiconductor layer 112a are etched to expose the first electrode 108. As for etching, dry etching may be performed by forming a mask over the single crystal semiconductor layer 112a and using a gas such as $NF_3$ or $SF_6$.

Figure 12A:
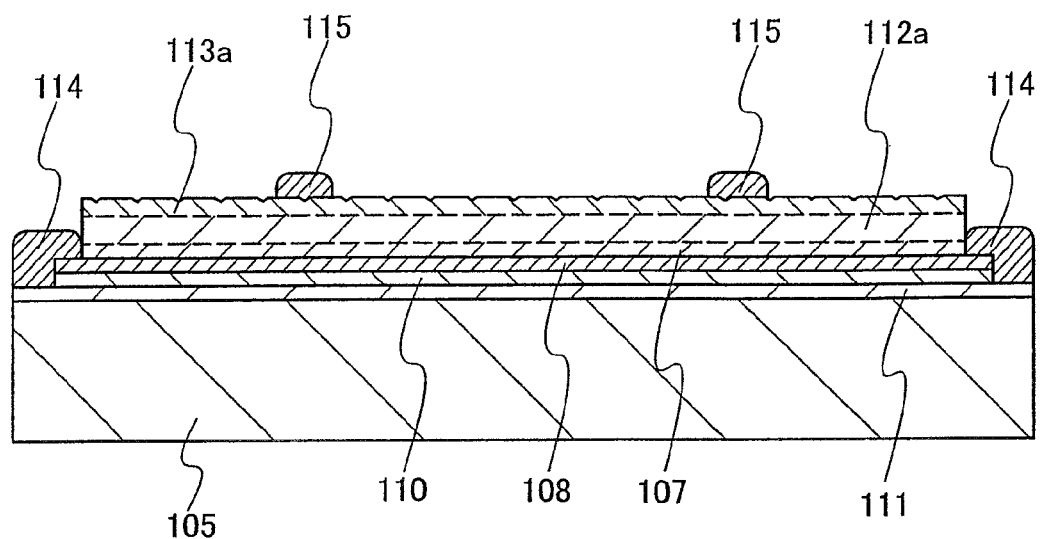
FIGS. 12A and 12B are illustrating a manufacturing process of a photoelectric conversion device.

FIG. 12A shows a step in which an auxiliary electrode 114 in contact with the first electrode 108, and a second electrode 115 over the second impurity semiconductor layer 113a are formed. The auxiliary electrode 114 is formed so as to be in contact with the first electrode 108 which is exposed by etching in FIG. 11C. The second electrode 115 has a comb-like or lattice-like shape as shown in a plan view of FIG. 7. The auxiliary electrode 114 and the second electrode 115 may be formed of aluminum, silver, lead-tin (solder), or the like. For example, the auxiliary electrode and the second electrode 115 are formed using a silver paste by a screen printing method.

Figure 12B:
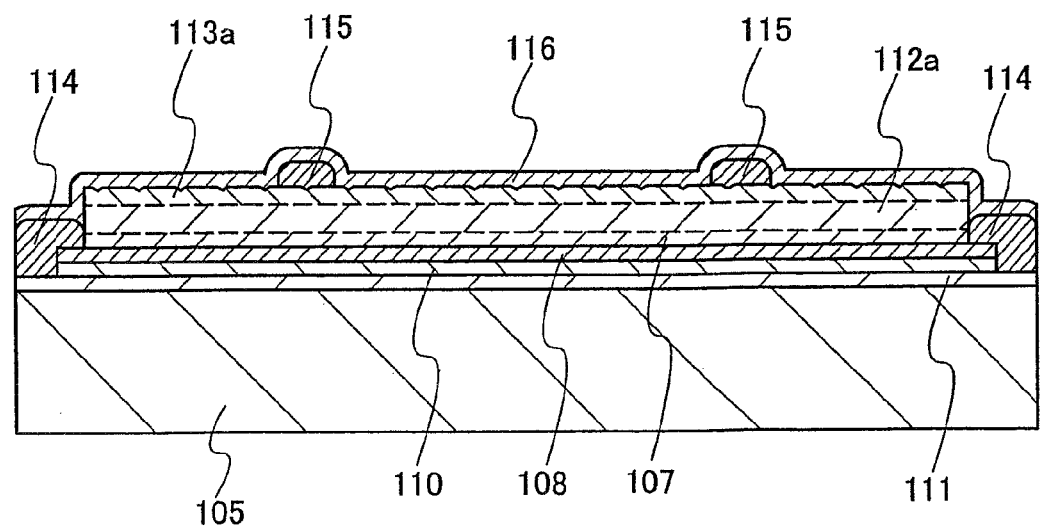

Then, as shown in FIG. 12B, an anti-reflective film 116 which serves as a passivation film is formed. The anti-reflective film 116 is preferably formed of a silicon nitride film, and may be formed of a stacked-layer of a silicon nitride film and a silicon nitride oxide film.

In an above-described manner, the photovoltaic conversion device 10 shown in FIG. 7 can be manufactured. According to this process, a photovoltaic conversion device having a single crystal semiconductor layer with a thickness of 10 μm or less can be manufactured at a process temperature of 700° C. or lower (preferably, 500° C. or lower) using a bonding technique between different materials and a laser processing technique. In other words, a photovoltaic conversion device including a single crystal semiconductor layer can be manufactured over a large-area glass substrate with an upper temperature limit of 700° C. or less. The single crystal semiconductor layer is obtained by separation of a surface layer part of a single crystal semiconductor substrate. Since the single crystal semiconductor substrate after the surface layer part of the single crystal semiconductor layer is separated can be repeatedly used, resources can be effectively used.

Embodiment Mode 2

Figure 16A:
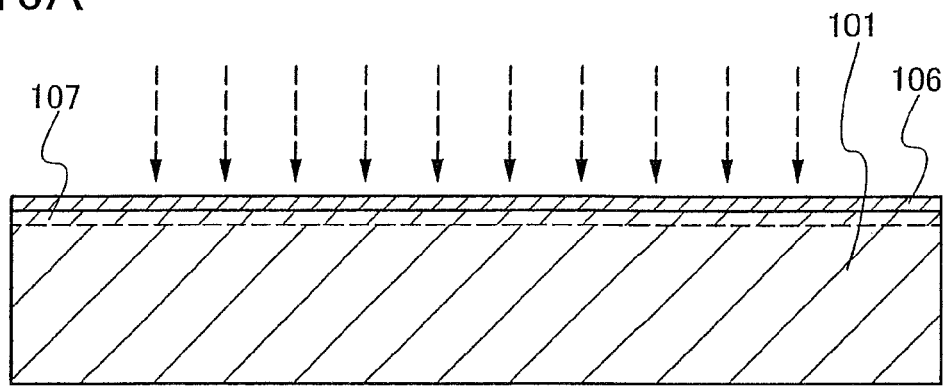
FIGS. 16A to 16C are cross sectional views illustrating a manufacturing process of a photoelectric conversion device.
Figure 16B:
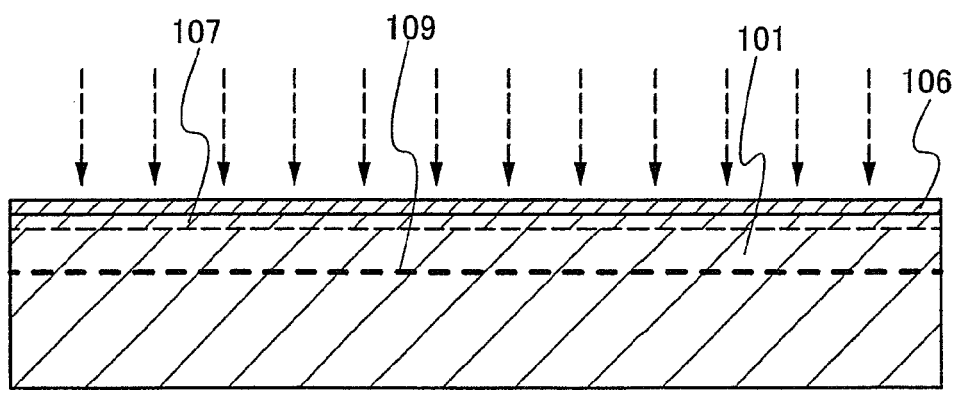
Figure 16C:
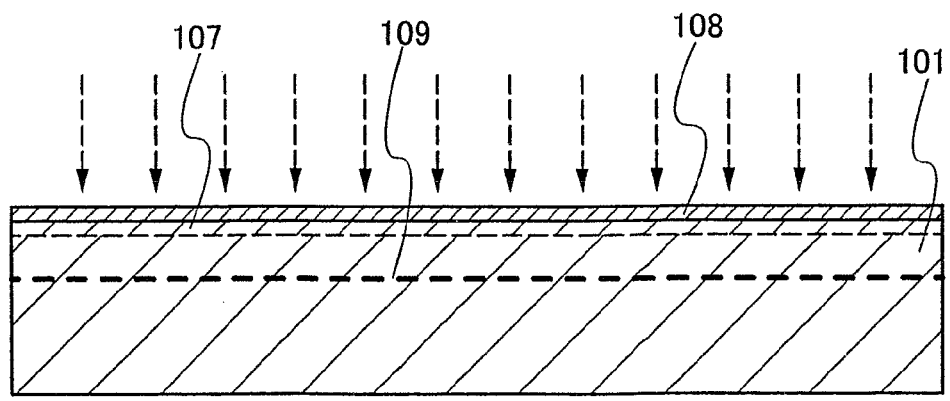

In this embodiment mode, a manufacturing process which is different from that in Embodiment Mode 1 is shown with reference to FIGS. 16A to 16C. As shown in FIG. 16A, the protective film 106 is formed over the semiconductor substrate 101 for transfer, an impurity imparting one conductivity type is added through the protective film 106 to form the first impurity semiconductor layer 107, and then, cluster ions of hydrogen are introduced with the protective film 106 left so as to form the damaged layer 109. Thereafter, as shown in FIG. 16C, the protective film 106 is removed and the first electrode 108 is formed.

By the above-described process, the protective film 106 can be effectively utilized as an anti-damage layer in ion doping. That is, by removing the protective film 106 that is damaged due to ion irradiation before forming the first electrode 108, the surface of the semiconductor substrate 101 for transfer can be prevented from being damaged. Moreover, cluster ions of hydrogen are introduced through the first impurity semiconductor layer 107 so as to form the damaged layer 109, thus the introduction can also serve as hydrogenation of the first impurity semiconductor layer 107.

Embodiment Mode 3

Figure 17A:
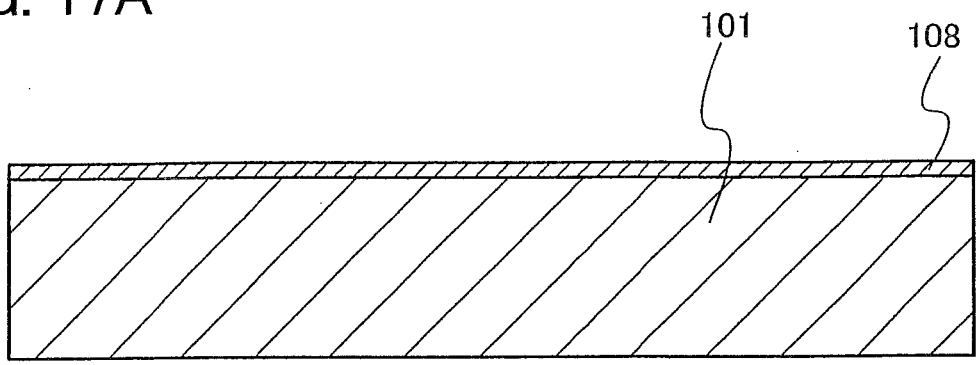
FIGS. 17A to 17C are cross sectional views illustrating a manufacturing process of a photoelectric conversion device.
Figure 17B:
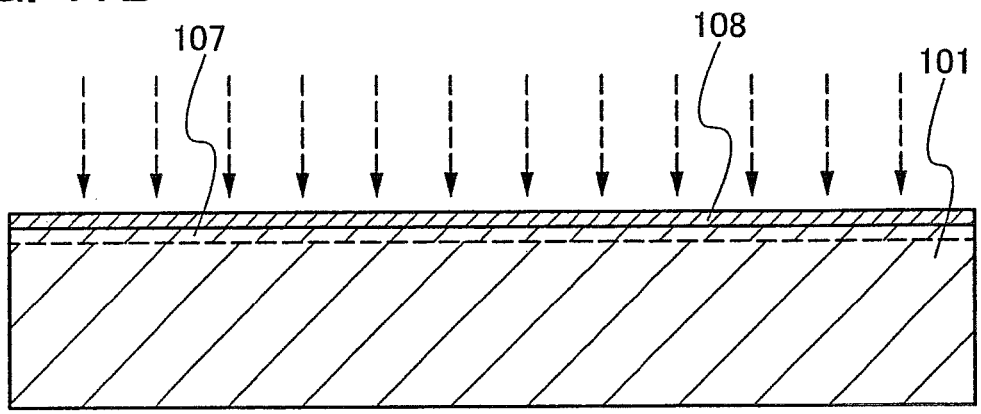
Figure 17C:
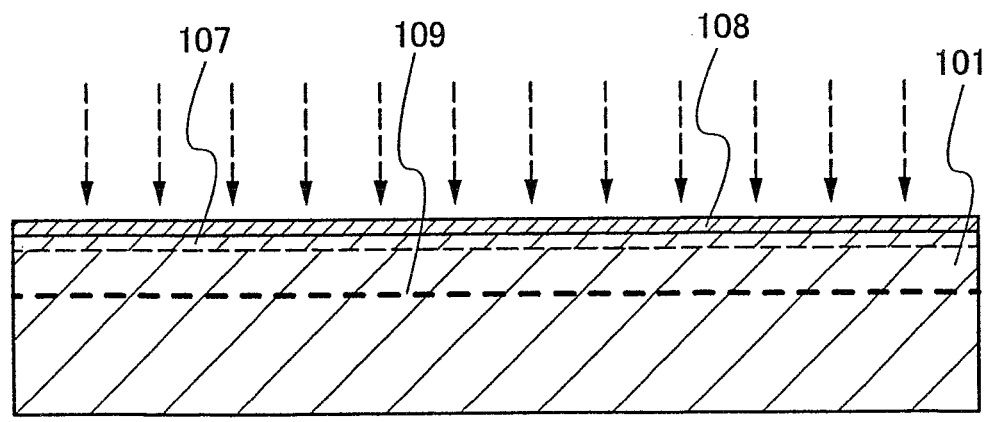

In this embodiment mode, a manufacturing process which is different from that in Embodiment Mode 1 is shown with reference to FIGS. 17A to 17C. As shown in FIG. 17A, the first electrode 108 is formed over the semiconductor substrate 101 for transfer, and as shown in FIG. 17B, an impurity imparting one conductivity type is added through the first electrode 108 so as to form the first semiconductor layer 107. Then, as shown in FIG. 17C, cluster ions of hydrogen are introduced through the first electrode 108 and the first impurity semiconductor layer 107 to form the damaged layer 109.

In this process, the first impurity semiconductor layer 107 is formed through the first electrode 108; thus the thickness of the first impurity semiconductor layer 107 can be controlled easily. Furthermore, the damaged layer 109 is formed after forming the first electrode 108; therefore, the first electrode 108 can be used as an anti-damage layer in ion doping. Accordingly, a step of forming a protective film for the ion doping can be omitted. Furthermore, cluster ions of hydrogen are introduced through the first impurity semiconductor layer 107 so as to form the damaged layer 109; thus the introduction can also serve as hydrogenation of the first impurity semiconductor layer 107.

Embodiment Mode 4

Figure 18A:
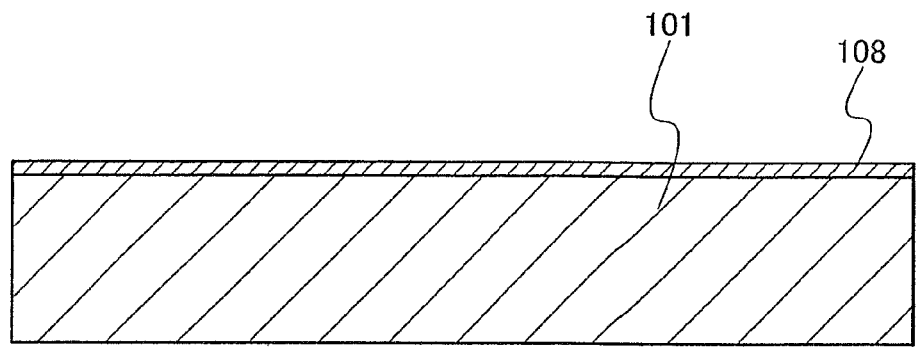
FIGS. 18A to 18C are cross sectional views illustrating a manufacturing process of a photoelectric conversion device.
Figure 18B:
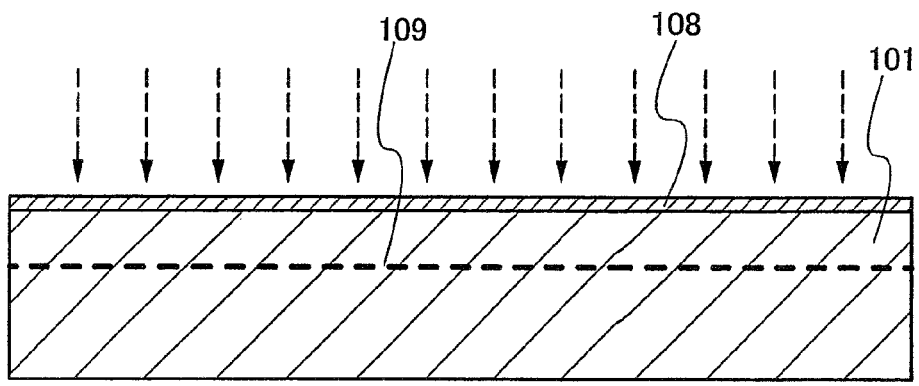
Figure 18C:
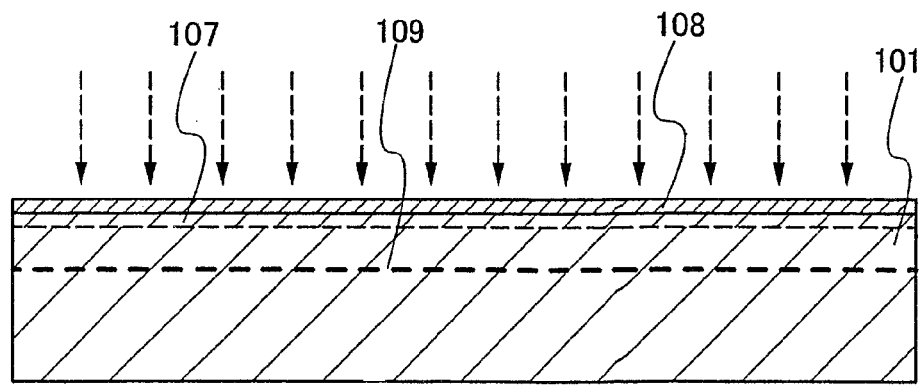

In this embodiment mode, a manufacturing process which is different from that in Embodiment Mode 1 is shown in FIGS. 18A to 18C. As shown in FIG. 18A, the first electrode 108 is formed over the semiconductor substrate 101 for transfer, and as shown in FIG. 18B, cluster ions of hydrogen are introduced through the first electrode 108 so as to form the damaged layer 109. Then, as shown in FIG. 18C, an impurity imparting one conductivity type is added through the first electrode 108 to form the first impurity semiconductor layer 107.

In this process, the first impurity semiconductor layer 107 is formed through the first electrode 108; thus the thickness of the first impurity semiconductor layer 107 can be controlled easily. Furthermore, the damaged layer 109 is formed after forming the first electrode 108; thus the first electrode 108 can be used as an anti-damage layer in ion doping. Accordingly, a step of forming a protective film for the ion doping can be omitted. Furthermore, the first impurity semiconductor layer 107 is formed after forming the damaged layer 109; thus the impurity concentration of the first impurity semiconductor layer 107 can be high, whereby shallow junction can be formed. Accordingly, a photovoltaic conversion device with high collection efficiency of photogenerated carriers can be manufactured by a back surface field (BSF) effect.

Embodiment Mode 5

Figure 19A:
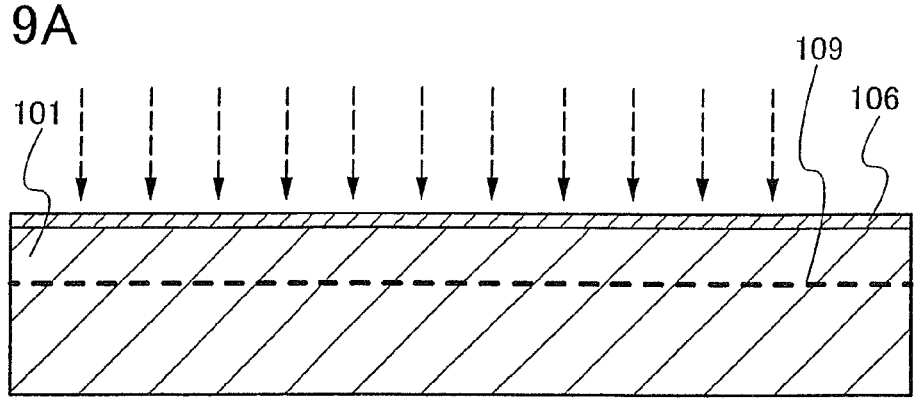
FIGS. 19A to 19C are cross sectional views illustrating a manufacturing process of a photoelectric conversion device.
Figure 19B:
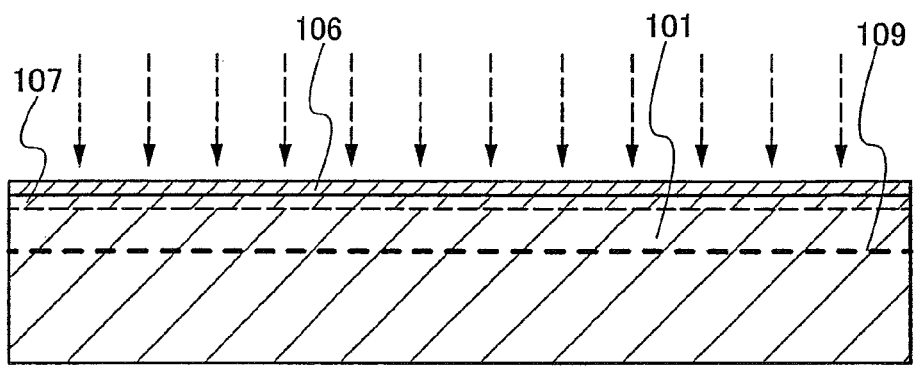
Figure 19C:
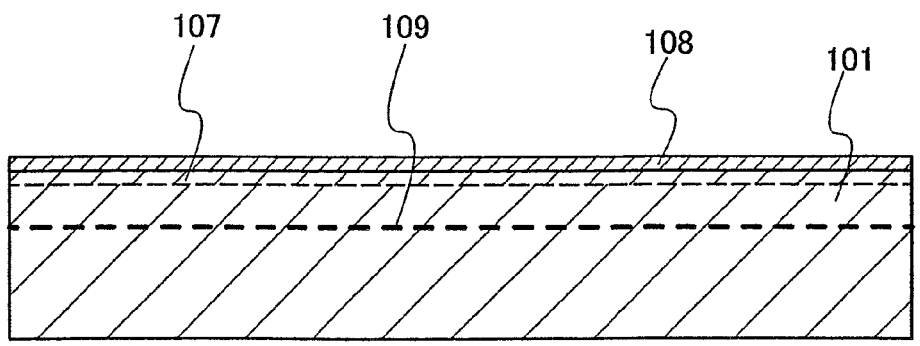

In this embodiment mode, a manufacturing process which is different from that in Embodiment Mode 1 is shown in FIGS. 19A to 19C. As shown in FIG. 19A, the protective film 106 is formed over the semiconductor substrate for transfer 101 and cluster ions of hydrogen are introduced to form the damaged layer 109; and as shown in FIG. 19B, an impurity imparting one conductivity type is added with the protective film 106 left so as to form the first impurity semiconductor layer 107. Then, as shown in FIG. 19C, the protective film 106 is removed and the first electrode 108 is formed.

By the above-described process, the protective film 106 can be effectively utilized as an anti-damage layer in ion doping. That is, by removing the protective film 106 that is damaged due to ion irradiation before forming the first electrode 108, the surface of the semiconductor substrate 101 for transfer can be prevented from being damaged. Furthermore, the first impurity semiconductor layer 107 is formed after forming the damaged layer 109; thus the impurity concentration of the first impurity semiconductor layer 107 can be high, whereby shallow junction can be formed. Accordingly, a photovoltaic conversion device with high collection efficiency of photogenerated carriers can be manufactured by a back surface field (BSF) effect.

Embodiment Mode 6

Figure 20A:
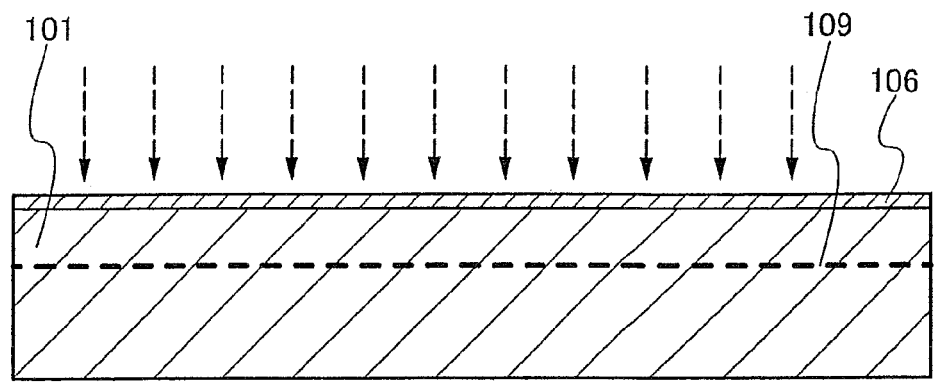
FIGS. 20A to 20C are cross sectional views illustrating a manufacturing process of a photoelectric conversion device.
Figure 20B:
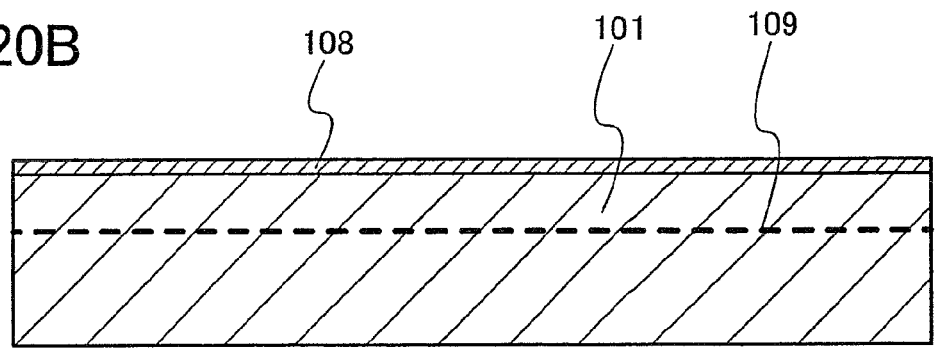
Figure 20C:
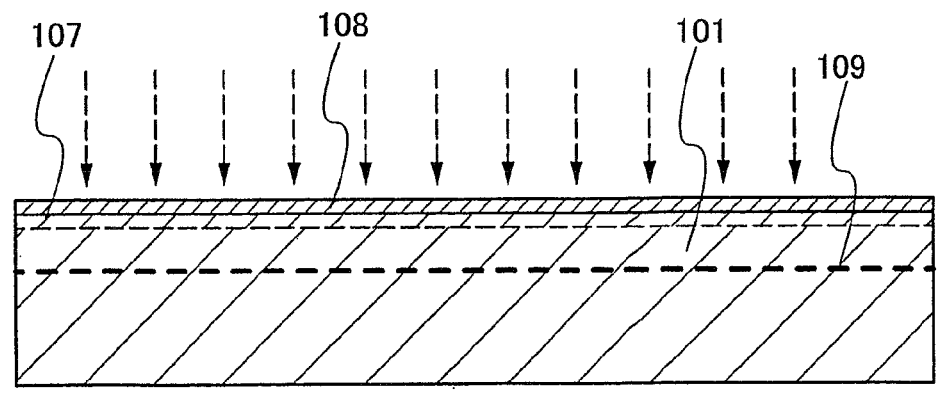

In this embodiment mode, a manufacturing process which is different from that in Embodiment Mode 1 is shown in FIGS. 20A to 20C. As shown in FIG. 20A, the protective film 106 is formed over the semiconductor substrate for transfer 101 and cluster ions of hydrogen are introduced through the protective film 106 to form the damaged layer 109; and as shown in FIG. 20B, the protective film 106 is removed and the first electrode 108 is formed. Then, as shown in FIG. 20C, an impurity imparting one conductivity type is added through the first electrode 108, thereby forming the first impurity semiconductor layer 107.

The protective film 106 can be effectively utilized as an anti-damage layer in ion doping. That is, by removing the protective film 106 that is damaged due to ion irradiation before forming the first electrode 108, the surface of the semiconductor substrate 101 for transfer can be prevented from being damaged. Furthermore, the first impurity semiconductor layer 107 is formed after forming the damaged layer 109; thus the impurity concentration of the first impurity semiconductor layer 107 can be high, whereby shallow junction can be formed. Accordingly, a photovoltaic conversion device with high collection efficiency of photogenerated carriers can be manufactured by a back surface field (BSF) effect. Furthermore, by forming the first impurity semiconductor layer 107 through the first electrode 108, the thickness of the first impurity semiconductor layer 107 can be controlled easily.

Embodiment Mode 7

Figure 21A:
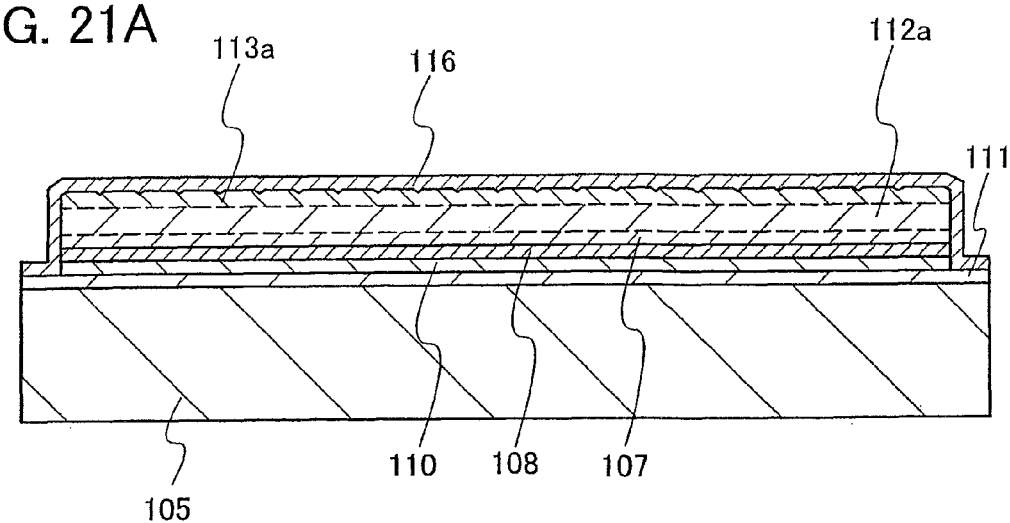
FIGS. 21A to 21C are cross sectional views illustrating a manufacturing process of a photoelectric conversion device.
Figure 21B:
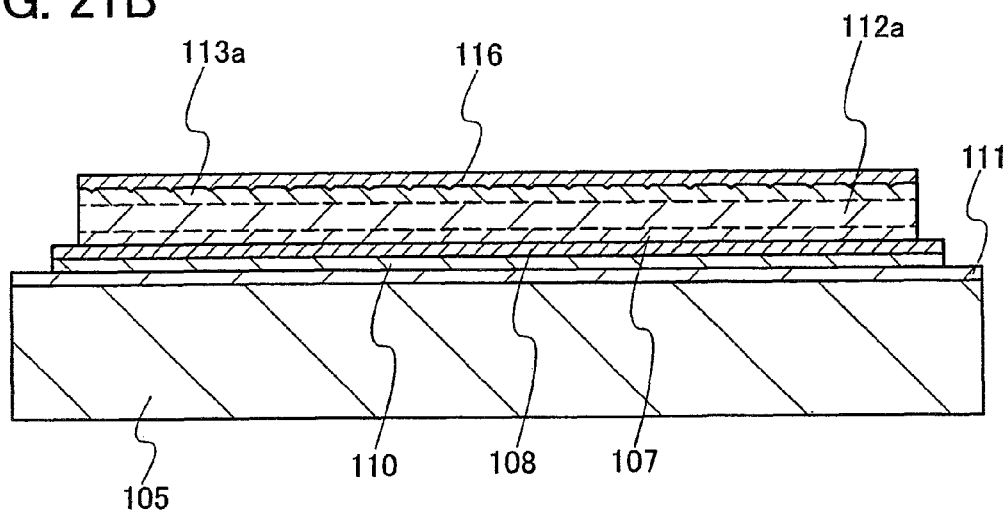
Figure 21C:
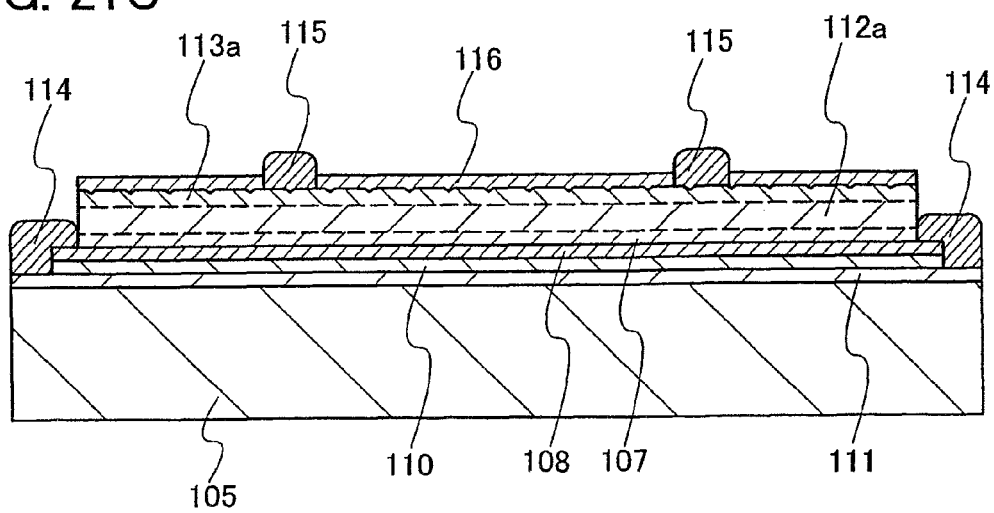

In this embodiment mode, a manufacturing process which is different from that in Embodiment Mode 1 is shown in FIGS. 21A to 21C. The single crystal semiconductor layer 112 is bonded to the supporting substrate 105; the second impurity semiconductor layer 113 is formed; laser processing (FIG. 11B) is performed thereon; and then, as shown in FIG. 21A, the anti-reflective film 116 is formed. Thereafter, as shown FIG. 21B, the end portions of the single crystal semiconductor layer 112a are etched to expose the first electrode 108, and as shown in FIG. 21C, the second electrode 115 and the auxiliary electrode 114 are formed. The second electrode 115 is formed over the anti-reflective film 116; however, the second electrode 115 can function as an electrode by instantaneously applying insulating breakdown voltage and forming a burn-in contact.

This embodiment mode can be freely combined with Embodiment Mode 2 to Embodiment Mode 6.

Embodiment Mode 8

In this embodiment mode, a manufacturing method which is different from that in Embodiment Mode 1 is shown in FIGS. 22A to 22C, and FIGS. 23A and 23B. After bonding the single crystal semiconductor layer 112 to the supporting substrate 105 (FIG. 9B), laser processing is performed to repair crystal defects which remain in the single crystal semiconductor layer 112. By irradiation of the single crystal semiconductor layer 112 with the laser beam 118, at least the surface side of the single crystal semiconductor layer 112 melts to be re-single-crystallized using the solid-state lower layer portion as a seed crystal in a later cooling process. In that process, the surface of the single crystal semiconductor layer 112 is planarized, so that a single crystal semiconductor layer 112b can be obtained. In this laser processing, at least a region irradiated with the laser beam is preferably heated at a temperature from 250° C. to 600° C. By heating the region to be irradiated, melting time by laser beam irradiation can be lengthened; thus the crystal defects can be effectively repaired. The irradiation with the laser beam 118 melts the surface side of the single crystal semiconductor layer 112 but the supporting substrate 105 is hardly heated. Therefore, a substrate with low heat resistance, such as a glass substrate can be used. Further, because the first electrode 108 is formed of heat-resistant metal, the first electrode 108 does not adversely affect the single crystal semiconductor layer 112 when it is heated at the above-mentioned temperature. A silicide is formed at an interface between the first electrode 108 and the first impurity semiconductor layer 107; thus current flows easily.

Note that the surface of the single crystal semiconductor layer 112 is closest to the damaged layer 109 or includes a part of the damaged layer 109; therefore, the surface layer of the single crystal semiconductor layer 112 is preferably removed by etching before laser processing which is to be performed later. As etching, dry etching or wet etching may be performed.

Figure 14:
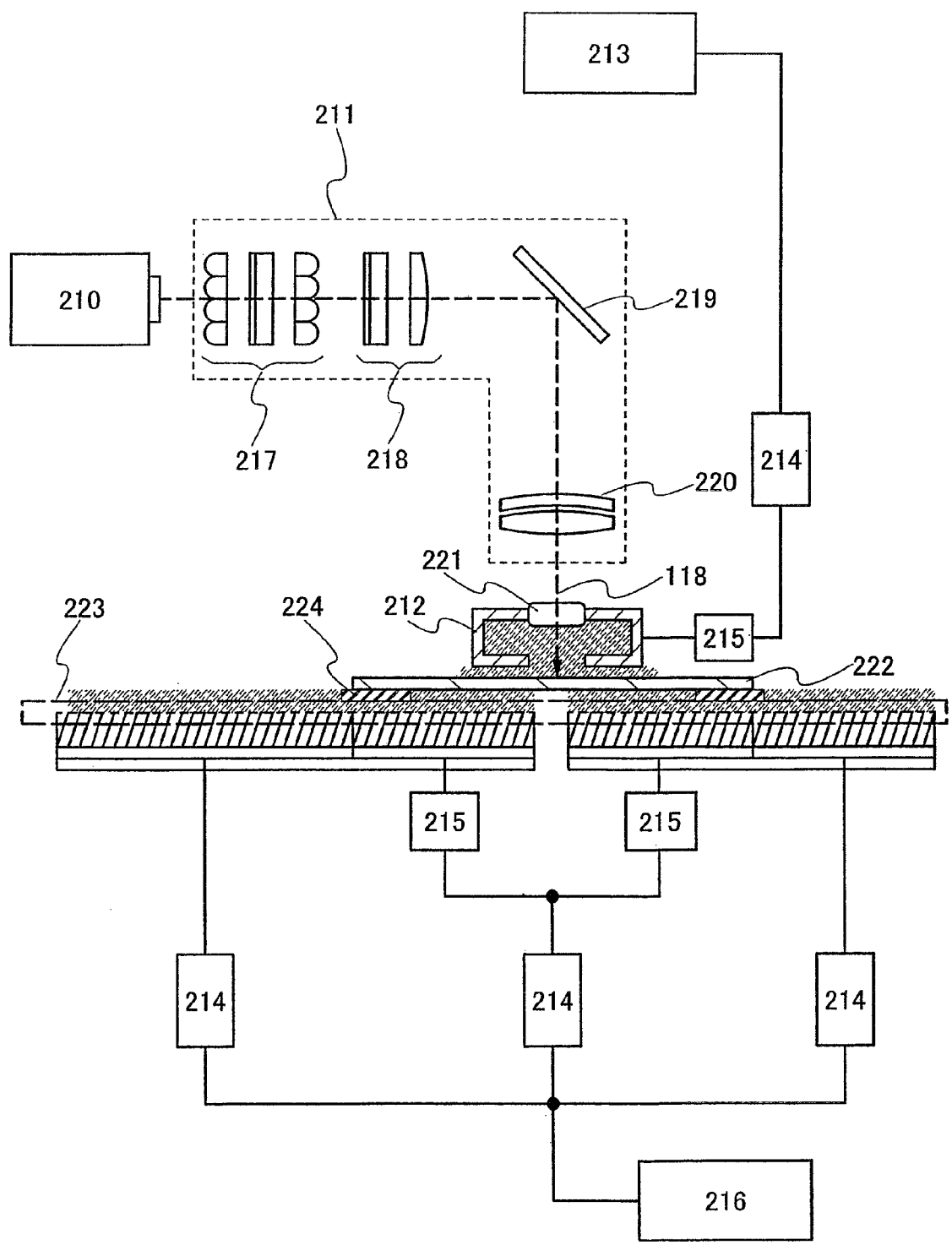
FIG. 14 is a conceptual diagram illustrating a structure of a laser processing apparatus.

As for the laser processing, a laser processing apparatus shown in FIG. 14 can be used, for example. The laser processing is performed by such a laser processing apparatus on the single crystal semiconductor layer 112 over the supporting substrate 105 as shown in FIG. 15.

Figure 22A:
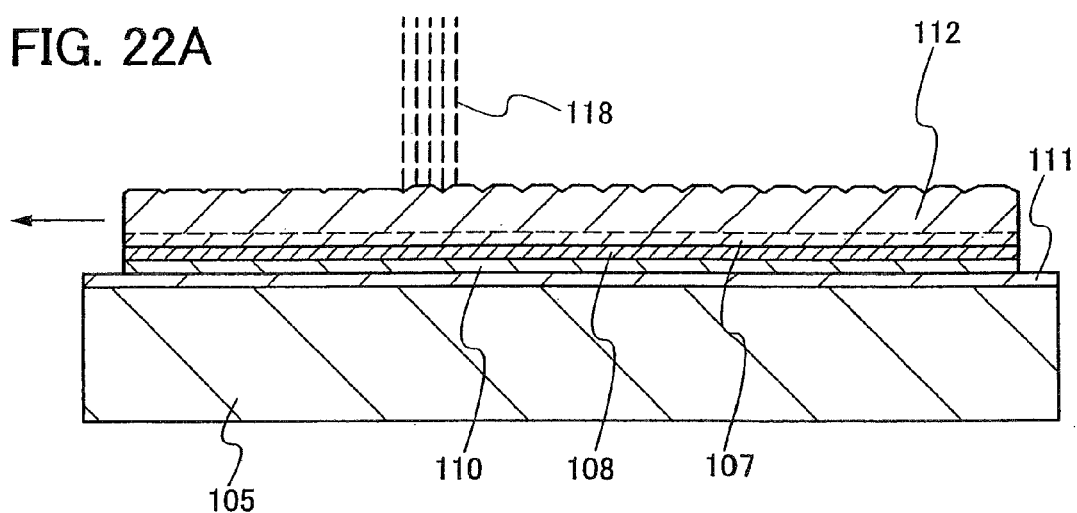
FIGS. 22A to 22C are cross sectional views illustrating a manufacturing process of a photoelectric conversion device.
Figure 22B:
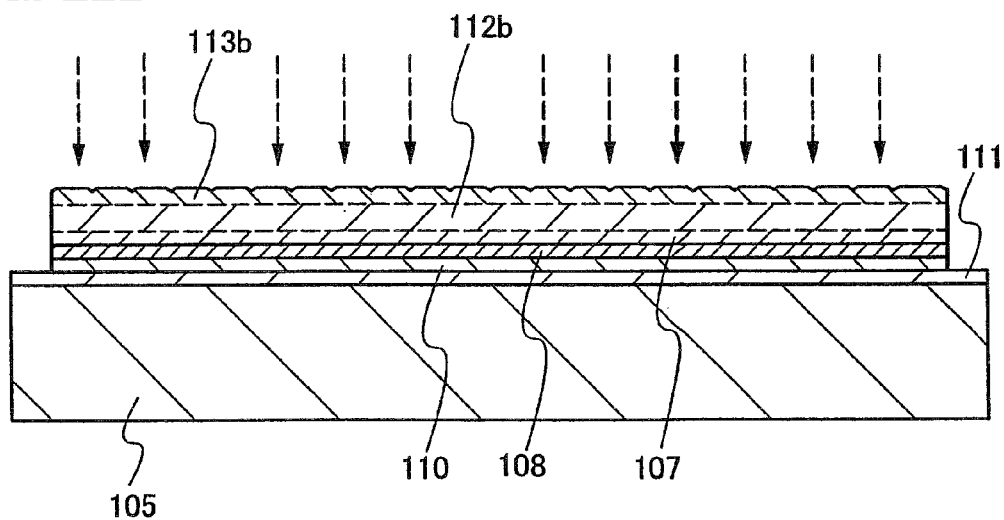

Thereafter, as shown in FIG. 22B, an impurity imparting an opposite conductivity type to the first impurity semiconductor layer 107 is added to the single crystal semiconductor layer 112b, whereby a second impurity semiconductor layer 113b is formed. For example, phosphorus or arsenic is added so that an n-type semiconductor layer is formed as the second impurity semiconductor layer 113b. In that case, because crystal defects at the surface of the single crystal semiconductor layer 112b are repaired and planarized by laser processing of a previous step, concentration of the impurity in the second impurity semiconductor layer 113b and the depth at which the impurity is added can be controlled precisely. That is, the surface of the single crystal semiconductor layer 112 is processed with laser beam irradiation, and then, the impurity is added to form the second impurity semiconductor layer 113b, whereby the concentration of the impurity contained in the second impurity semiconductor layer 113b can be high, and shallow junction can be formed. Accordingly, a photovoltaic conversion device with high collection efficiency of photogenerated carriers can be manufactured. Further, by performing the laser processing before forming the second impurity semiconductor layer 113b, a melted region due to laser beam irradiation can be expanded to an inner portion of the single crystal semiconductor layer 112, and an effect of repairing crystal defects by re-single-crystallized can be enhanced.

Figure 22C:
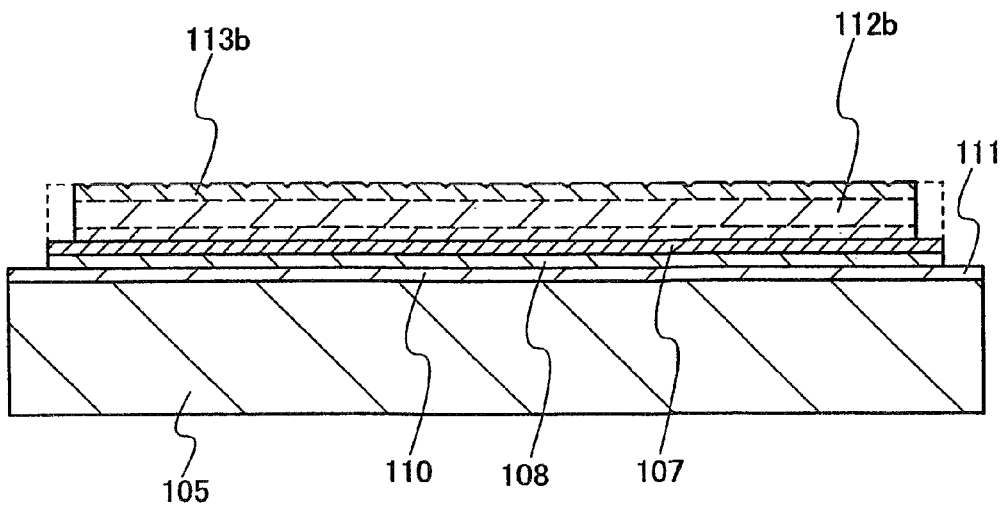

FIG. 22C shows a step in which the end portions of the single crystal semiconductor layer 112b are etched to expose the first electrode 108. As for etching, dry etching may be performed by forming a mask over the single crystal semiconductor layer 112b and using a gas such as $NF_3$ or $SF_6$.

Figure 23A:
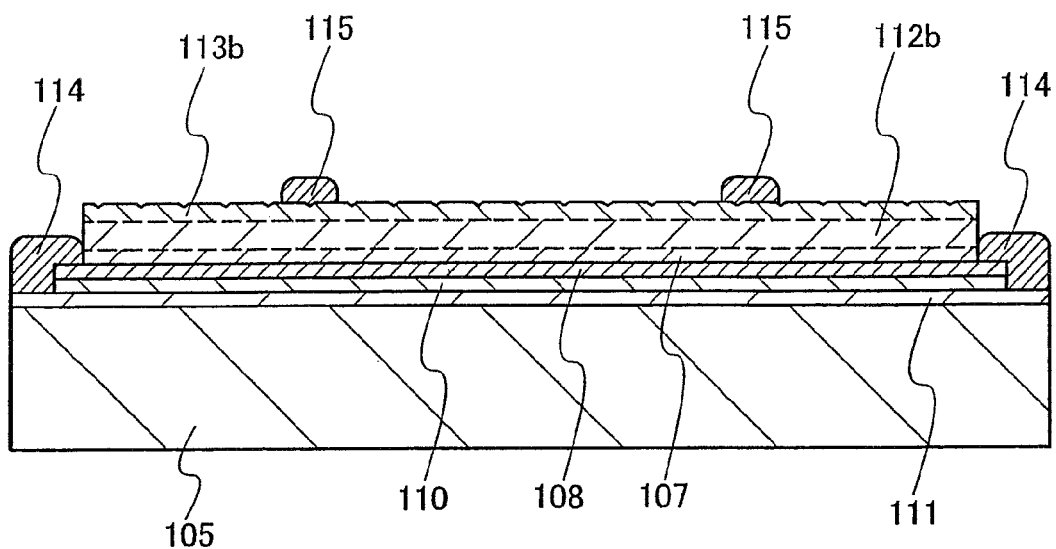
FIGS. 23A and 23B are cross sectional views illustrating a manufacturing process of a photoelectric conversion device.

FIG. 23A shows a step in which the auxiliary electrode 114 in contact with the first electrode 108, and the second electrode 115 over the second impurity semiconductor layer 113b are formed. The auxiliary electrode 114 is formed so as to be in contact with the first electrode 108 which is exposed by etching in FIG. 11C. The second electrode 115 has a comb-like or lattice-like shape as shown in a plan view of FIG. 7. The auxiliary electrode 114 and the second electrode 115 may be formed of aluminum, silver, lead-tin (solder), or the like.

For example, the auxiliary electrode and the second electrode 115 are formed using a silver paste by a screen printing method.

Figure 23B:
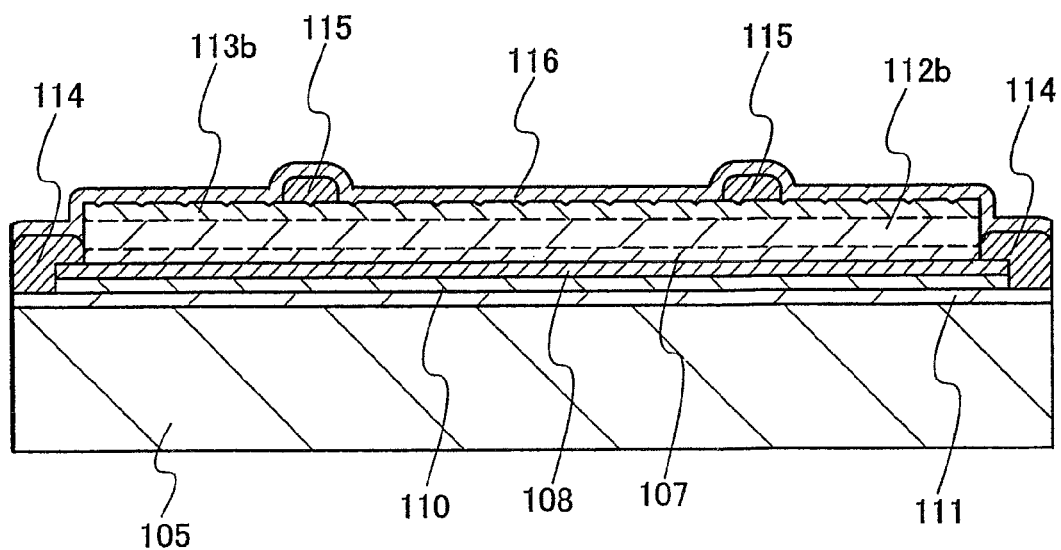

Then, as shown in FIG. 23B, the anti-reflective film 116 which serves as a passivation film is formed. The anti-reflective film 116 is preferably formed of a silicon nitride film, and may be formed of a stacked-layer of a silicon nitride film and a silicon nitride oxide film.

In an above-described manner, the photovoltaic conversion device 10 shown in FIG. 7 can be manufactured. According to this process, a photovoltaic conversion device having a single crystal semiconductor layer with a thickness of 10 µm or less can be manufactured at a process temperature of 700° C. or lower (preferably, 500° C. or lower) using a bonding technique between different kinds of materials and a laser processing technique. In other words, a photovoltaic conversion device including a single crystal semiconductor layer can be manufactured over a large-area glass substrate with an upper temperature limit of 700° C. or less. The single crystal semiconductor layer is obtained by separation of a surface layer part of a single crystal semiconductor substrate. Since the single crystal semiconductor substrate after the surface layer part of the single crystal semiconductor layer is separated can be repeatedly used, resources can be effectively used.

This embodiment mode can be freely combined with Embodiment Mode 2 to Embodiment Mode 6.

Embodiment Mode 9

Figure 24A:
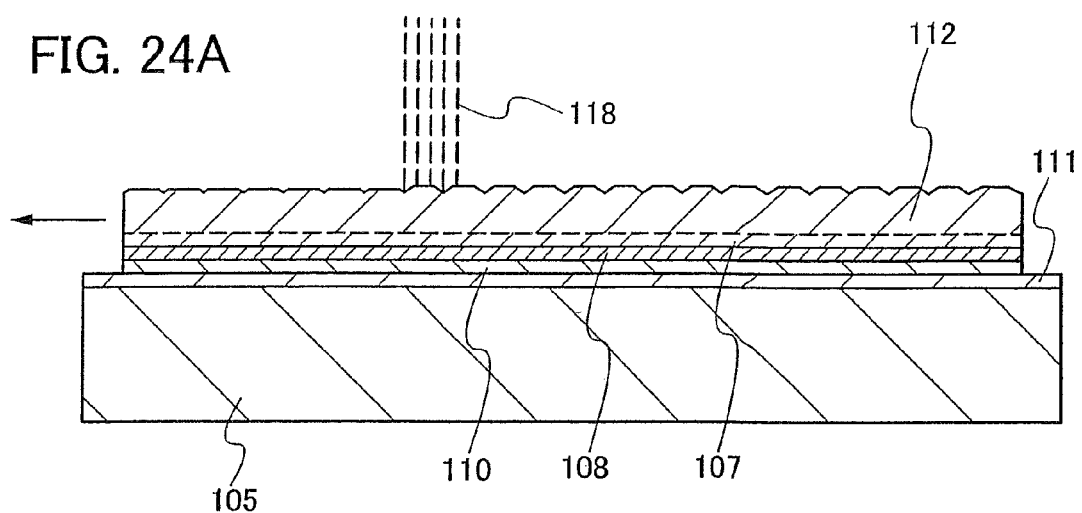
FIGS. 24A to 24C are cross sectional views illustrating a manufacturing process of a photoelectric conversion device.
Figure 24B:
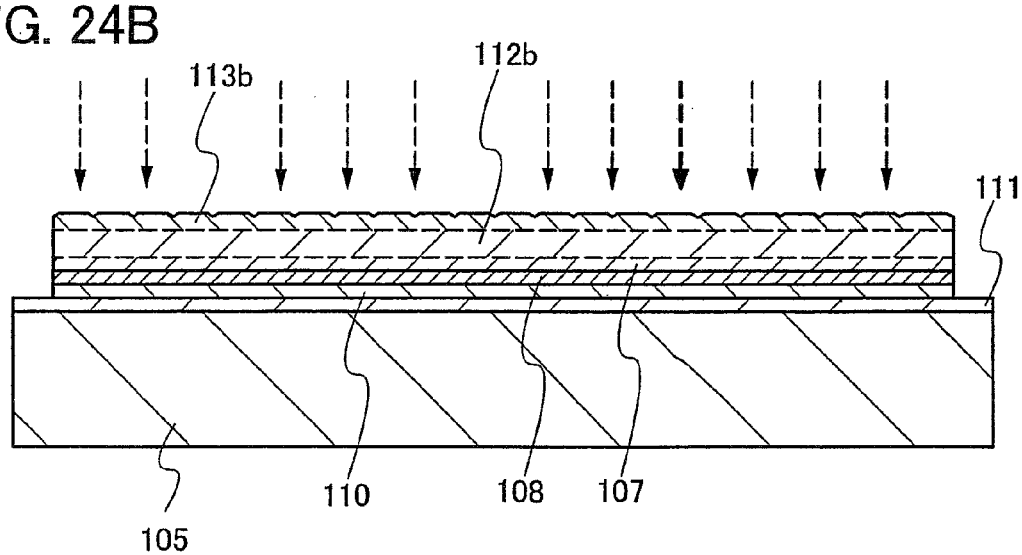

In this embodiment mode, a manufacturing process which is different from that in Embodiment Mode 1 is shown in FIGS. 24A to 24C, and FIGS. 25A and 25B. After bonding the single crystal semiconductor layer 112 over the supporting substrate 105 (FIG. 9B), as described in FIG. 22A, laser processing is performed to repair crystal defects which remain in the single crystal semiconductor layer 112, as shown in FIG. 24A.

Thereafter, as described in FIG. 22B, an impurity imparting an opposite conductivity type to that of the first impurity semiconductor layer 107 is added to the single crystal semiconductor layer 112b, whereby the second impurity semiconductor layer 113b is formed. Further, by performing the laser processing before forming the second impurity semiconductor layer 113b, a melted region due to laser beam irradiation can be expanded to an inner portion of the single crystal semiconductor layer 112, and an effect of repairing crystal defects by re-single-crystallization can be enhanced.

Figure 24C:
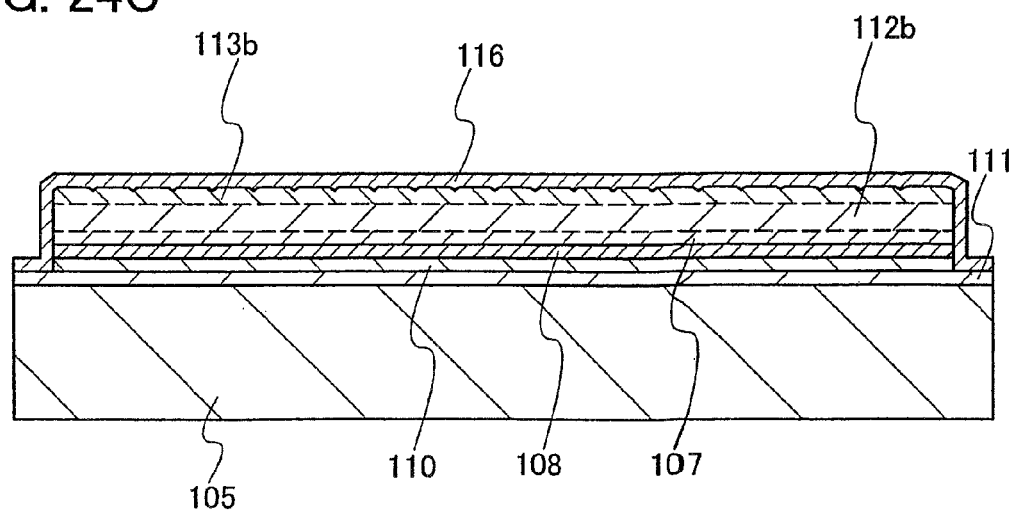

Then, the anti-reflective film 116 is formed as shown in FIG. 24C.

Figure 25A:
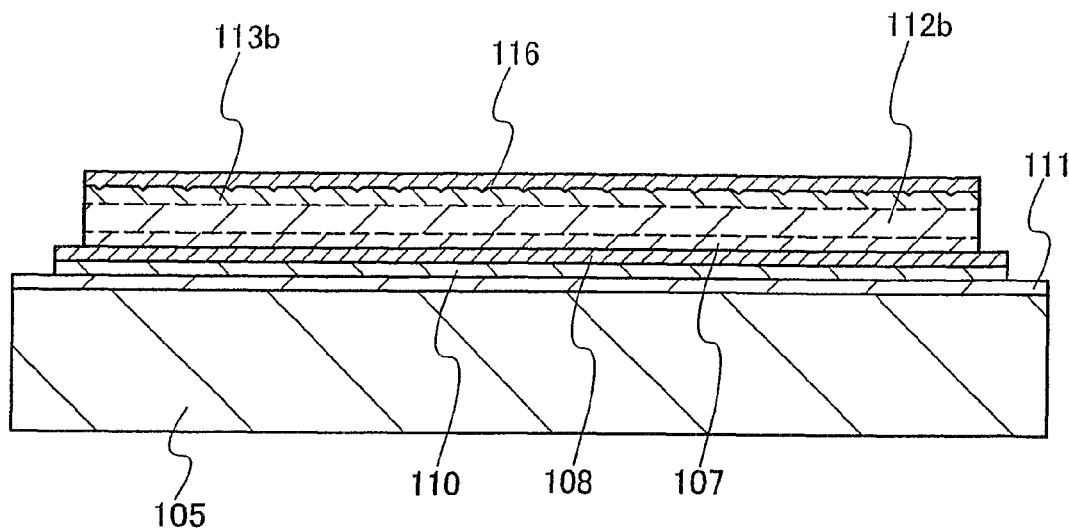
FIGS. 25A and 25B are cross sectional views illustrating a manufacturing process of a photoelectric conversion device.
Figure 25B:
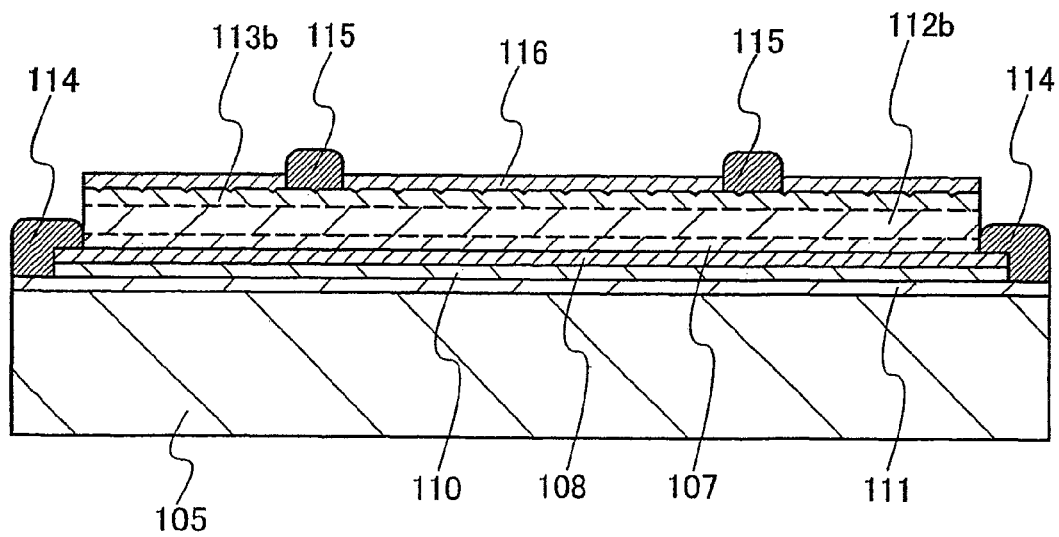

Thereafter, as shown in FIG. 25A, the end portions of the single crystal semiconductor layer 112b are etched to expose the first electrode 108, and as shown in FIG. 25B, the second electrode 115 and the auxiliary electrode 114 are formed. The second electrode 115 are formed over the anti-reflective film 116; however, the second electrode 115 can function as an electrode by instantaneously applying insulating breakdown voltage and forming a burn-in contact.

According to this embodiment mode, the anti-reflective film 116 functioning as a passivation film is formed after the second impurity semiconductor layer 113b is formed over the single crystal semiconductor layer 112b; therefore, surface recombination velocity can be decreased, and conversion efficiency of a photoelectric conversion device can be enhanced.

This embodiment mode can be freely combined with Embodiment Mode 2 to Embodiment Mode 6.

Embodiment Mode 10

Figure 26A:
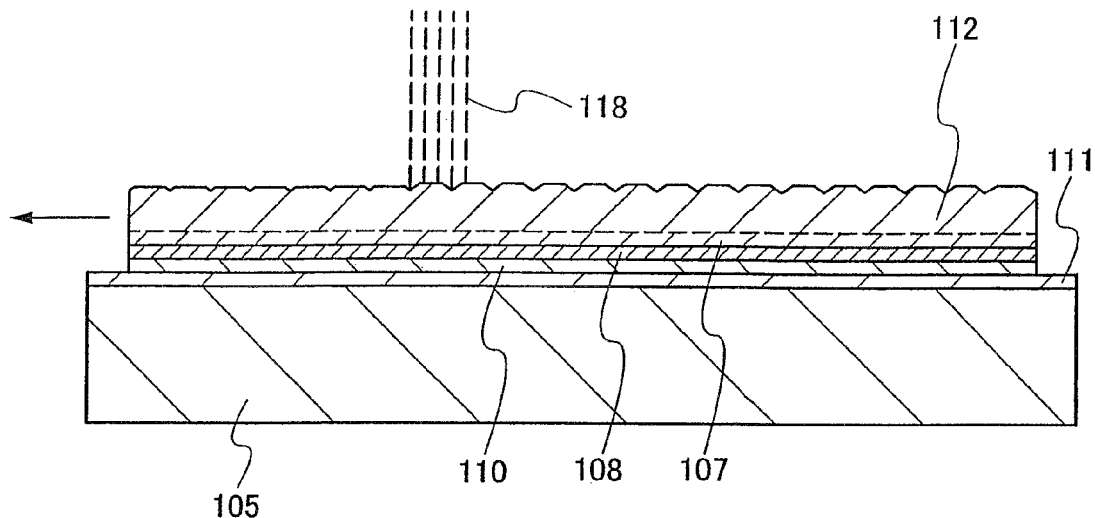
FIGS. 26A to 26C are cross sectional views illustrating a manufacturing process of a photoelectric conversion device.
Figure 26B:
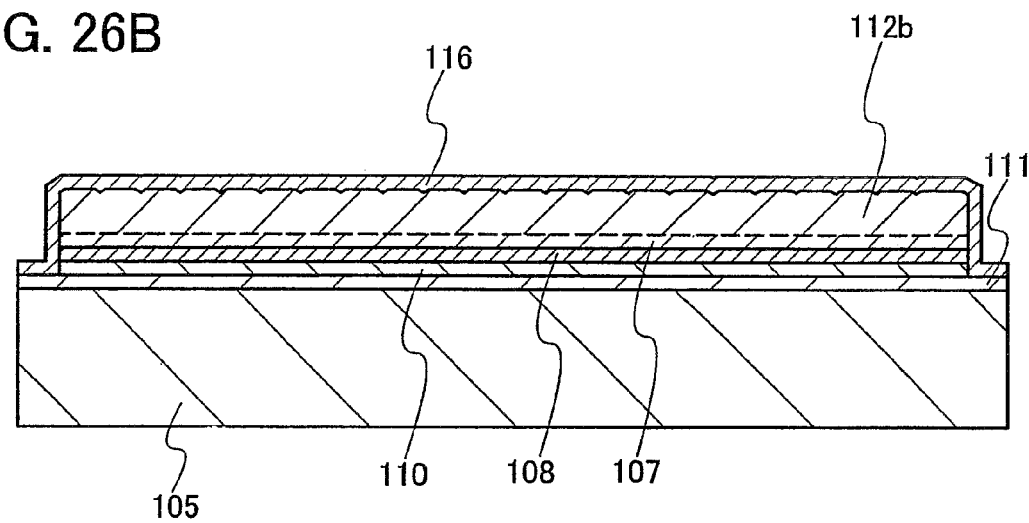
Figure 26C:
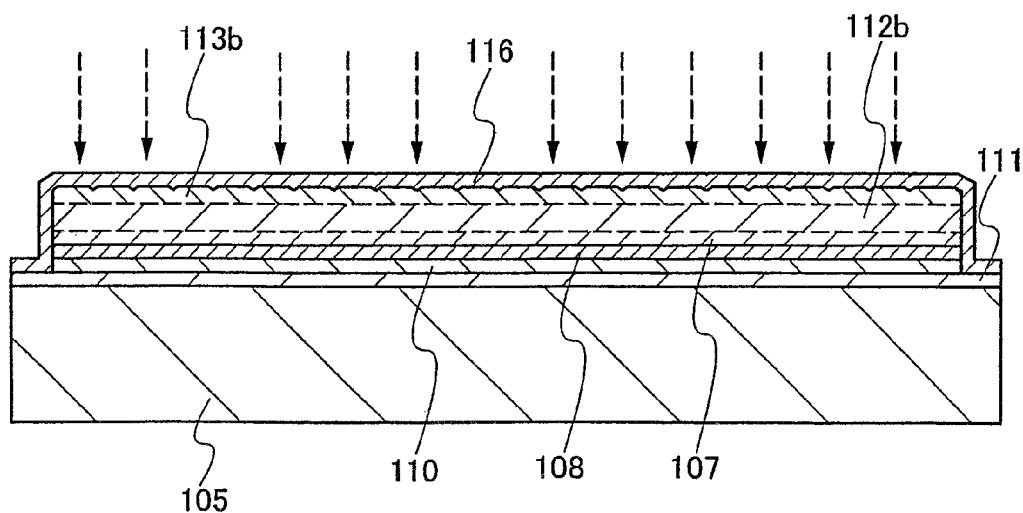

In this embodiment mode, a manufacturing process which is different from that in Embodiment Mode 1 is shown in FIGS. 26A to 26C. After bonding the single crystal semiconductor layer 112 over the supporting substrate 105 (FIG. 9B), as described in FIG. 22A, laser processing is performed to repair crystal defects which remain in the single crystal semiconductor layer 112, as shown in FIG. 26A. By irradiation with the laser beam 118, at least the surface side of the single crystal semiconductor layer 112 melts to be re-single-crystallized using the solid-state lower layer portion as a seed crystal in a later cooling process. In that process, the surface of the single crystal semiconductor layer 112 is planarized, so that the single crystal semiconductor layer 112b can be obtained.

Thereafter, the anti-reflective film 116 is formed as shown in FIG. 26B.

Then, as shown in FIG. 26C, an impurity imparting an opposite conductivity type to that of the first impurity semiconductor layer 107 is added to the single crystal semiconductor layer 112b, whereby the second impurity semiconductor layer 113b is formed. According to this embodiment mode, by performing the laser processing before forming the second impurity semiconductor layer 113b, a melted region due to laser beam irradiation can be expanded to an inner portion of the single crystal semiconductor layer 112, and an effect of repairing crystal defects by re-single-crystallization can be enhanced.

Thereafter, as shown in FIG. 25A, the end portions of the single crystal semiconductor layer 112b are etched to expose the first electrode 108, and as shown in FIG. 25B, the second electrode 115 and the auxiliary electrode 114 are formed. The second electrode 115 are formed over the anti-reflective film 116; however, the second electrode 115 can function as an electrode by instantaneously applying insulating breakdown voltage and forming a burn-in contact.

This embodiment Mode can be freely combined with Embodiment Mode 2 to Embodiment Mode 6.

Embodiment Mode 11

Figure 27A:
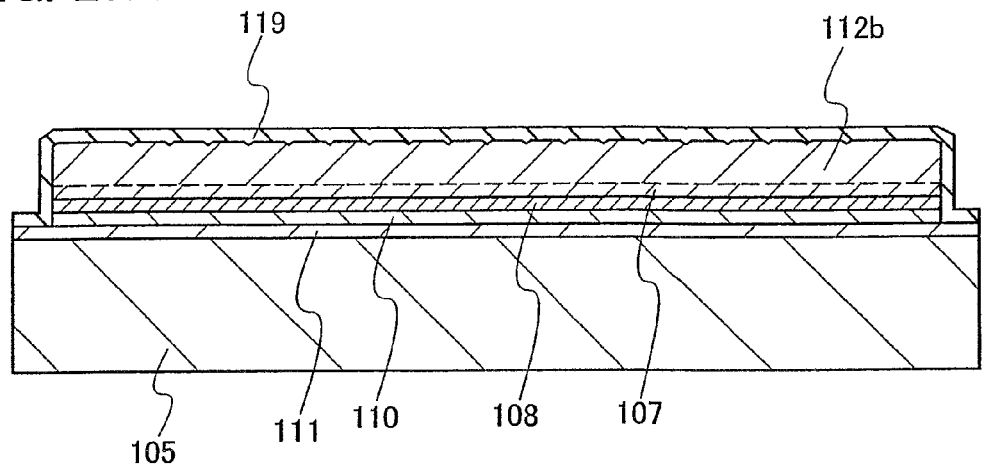
FIGS. 27A to 27C are cross sectional views illustrating a manufacturing process of a photoelectric conversion device.
Figure 27B:
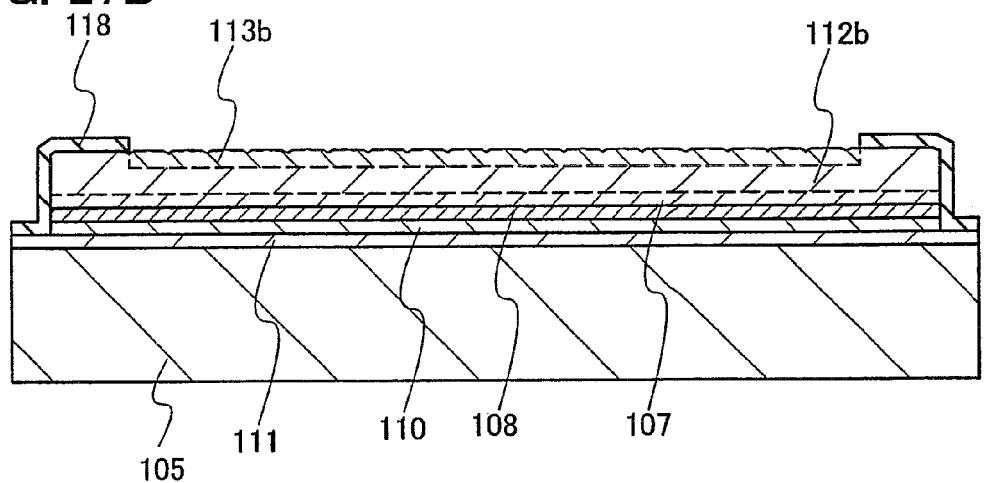
Figure 27C:
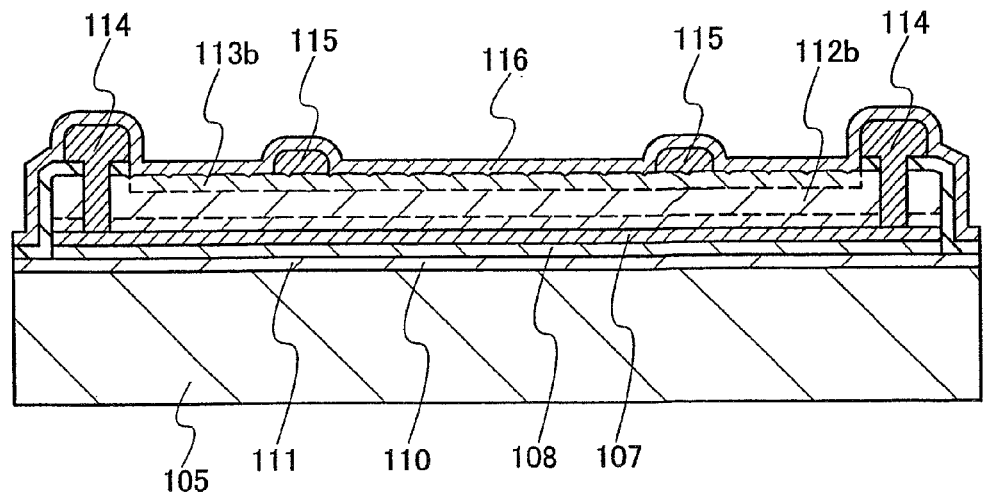

In this embodiment mode, a manufacturing process which is different from that in Embodiment Mode 1 is shown in FIGS. 27A to 27C. After bonding the single crystal semiconductor layer 112 over the supporting substrate 105 (FIG. 9B), and performing laser processing to repair crystal defects which remain in the single crystal semiconductor layer 112 (FIG. 22A), as shown in FIG. 27A, the insulating layer 119 is formed over the single crystal semiconductor layer 112b.

Thereafter, as shown in FIG. 27B, the opening portion is formed in the insulating layer 119 to expose the single crystal semiconductor layer 112b, and then, an impurity imparting an opposite conductivity type to that of the first impurity semiconductor layer 107 is added to the single crystal semiconductor layer 112b, whereby the second impurity semiconductor layer 113b is formed in the opening portion. By performing the laser processing before forming the second impurity semiconductor layer 113b, a melted region due to irradiation of the laser beam 118 can be expanded to an inner portion of the single crystal semiconductor layer 112, and an effect of repairing crystal defects by re-single-crystallization can be enhanced.

Thereafter, as shown in FIG. 27C, an opening portion penetrating through the insulating layer 119 and the single crystal semiconductor layer 112b to reach the first electrode 108 is formed, and the auxiliary electrode 114 and the second electrode 115 are formed. Further, the anti-reflective film 116 is formed. In this embodiment mode, the opening portion is formed inside the single crystal semiconductor layer 112b, and the auxiliary electrode 114 which is electrically connected to the first electrode 108 is formed; therefore, a photoelectric conversion device can be downsized.

This embodiment mode can be freely combined with Embodiment Mode 2 to Embodiment Mode 6.

Embodiment 1

In this embodiment, an example of a solar photovoltaic module using a photovoltaic conversion device manufactured according to the present invention, and a solar photovoltaic system using the solar photovoltaic module will be described.

Figure 28A:
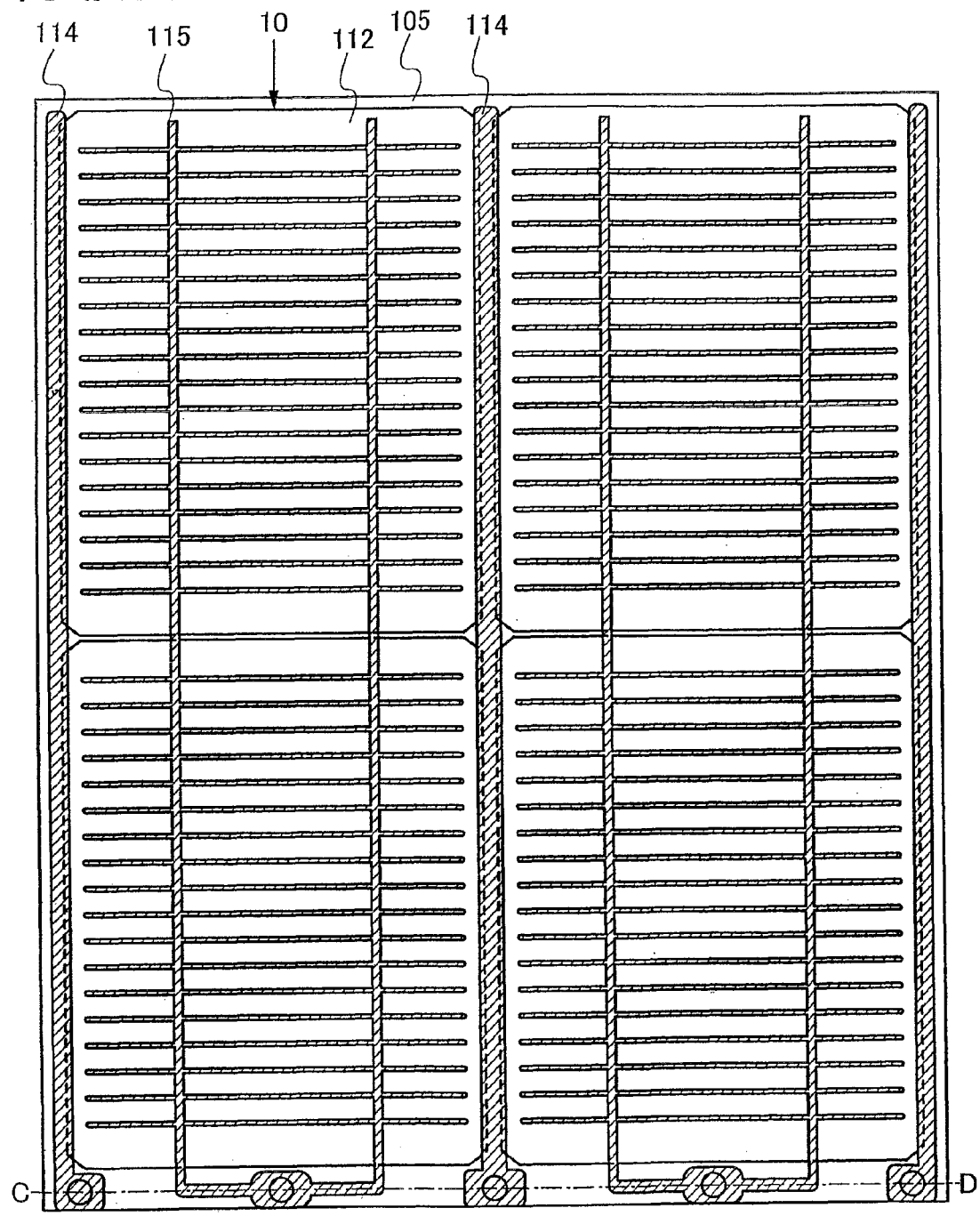
FIGS. 28A and 28B are a plane view illustrating a structure of a solar photovoltaic module.
Figure 28B:
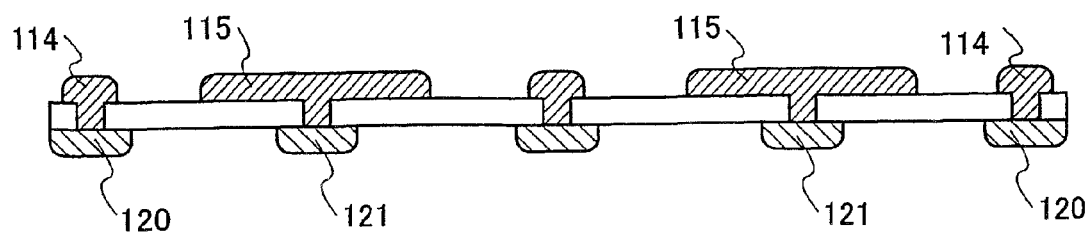

FIGS. 28A and 28B show a structure of a solar photovoltaic module. A solar photovoltaic module 12 of FIG. 28A includes the photovoltaic conversion device 10 in which the single crystal semiconductor layer 112 is bonded to the supporting substrate 105. The single crystal semiconductor layer 112 includes the first impurity semiconductor layer and the second impurity semiconductor layer which have a function of photoelectric conversion.

The auxiliary electrode 114 is an electrode connected to the first electrode which is formed on the rear surface side of the single crystal semiconductor layer 112, and the second electrode 115 is an electrode having a comb-like or lattice-like shape. The auxiliary electrode 114 and the second electrode 115 are formed over one surface of the supporting substrate 105, and are connected to a first rear surface electrode 120 and a second rear surface electrode 121 for connectors, respectively, at a region of the end portions of the supporting substrate 105. FIG. 28B is a cross sectional view corresponding to a cutoff line C-D of FIG. 28A. The auxiliary electrode 114 and the second electrode 115 are connected to the first rear surface electrode 120 and the second rear surface electrode 121, respectively, through an opening of the supporting substrate 105.

As described, a photovoltaic conversion device 10 is formed by bonding the single crystal semiconductor layer 112 over the supporting substrate 105; whereby a solar photovoltaic module can be made thin.

Figure 29:
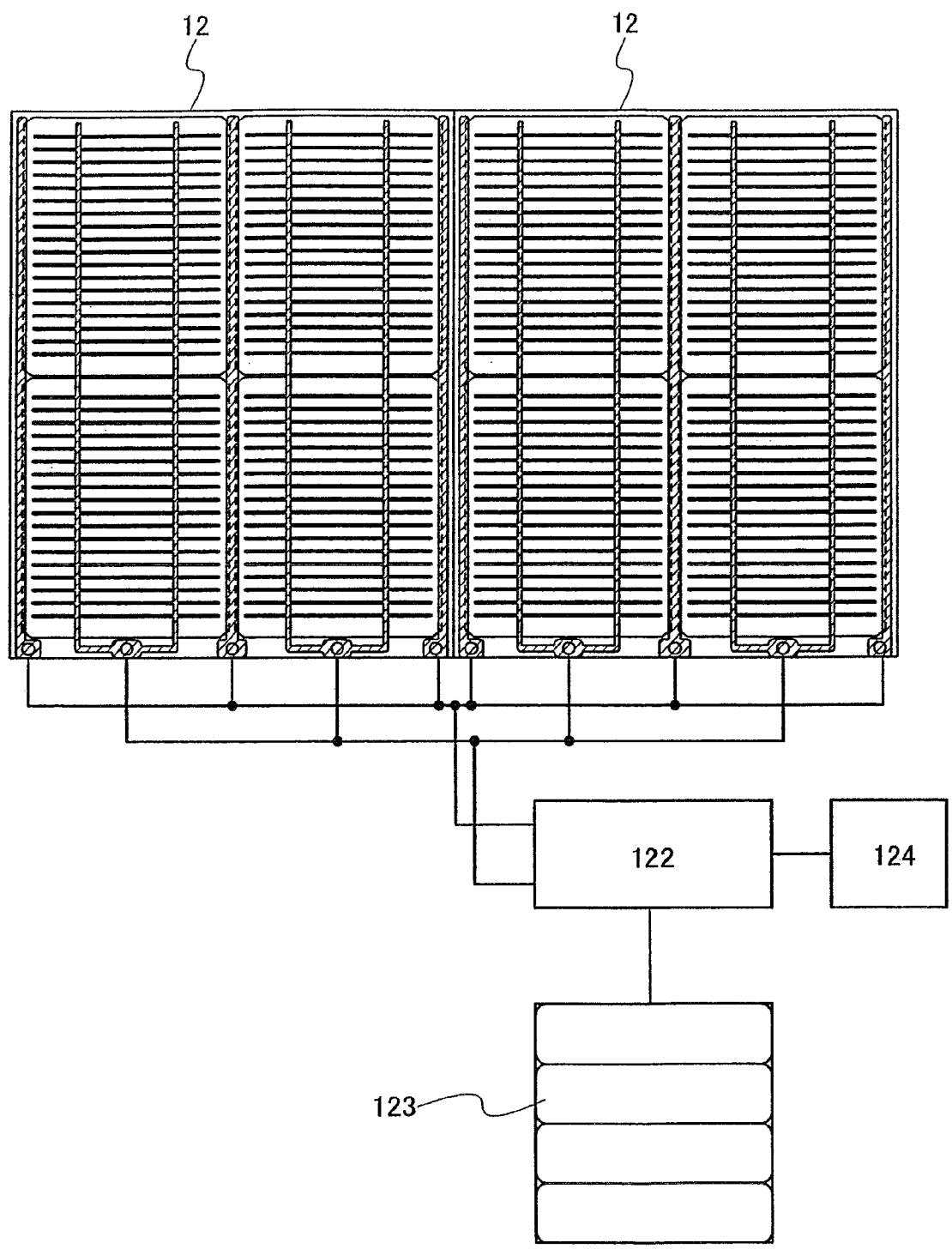
FIG. 29 describes an example of a solar photovoltaic system.

FIG. 29 shows an example of a solar photovoltaic system using the solar photovoltaic module 12. The output power of one or a plurality of the solar photovoltaic modules 12 charges a rechargeable battery 123 using a charging controller circuit 122. When the amount of the charge is large, there is a case where the output power is directly outputted to a load 124.

When an electric-double layer capacitor is used as the rechargeable battery 123, the battery can be charged rapidly without requiring a chemical reaction for the charge. Furthermore, by using the electric-double layer capacitor, the lifetime and the charge-discharge efficiency can be increased by about eight times and half time, respectively as compared to the case of using a lead storage battery utilizing a chemical reaction. The load 124 can be applied to various uses such as lighting such as a fluorescent light, a light-emitting diode, and an electroluminescence panel; small electronic devices; and the like.

This application is based on Japanese Patent Application serial no. 2007-285252 filed with Japan Patent Office on Nov. 1, 2007, and Japanese Patent Application serial no. 2007-

285253 filed with Japan Patent Office on Nov. 1, 2007, the entire contents of which are hereby incorporated by reference.

The invention claimed is:

1. A method for manufacturing a photoelectric conversion device comprising the steps of:
　　forming a damaged layer in a single crystal semiconductor substrate by irradiating a first surface of the single crystal semiconductor substrate with an ion beam;
　　forming a first impurity semiconductor layer on and in contact with the first surface, wherein the first impurity semiconductor layer has one conductivity type;
　　forming a first electrode on and in contact with the first impurity semiconductor layer;
　　forming a bonding layer over the first electrode;
　　attaching a supporting substrate to the bonding layer;
　　separating a part of the single crystal semiconductor substrate using the damaged layer as a boundary, wherein the part of the single crystal semiconductor substrate is not separated from the supporting substrate;
　　forming a second impurity semiconductor layer on a second surface of the part of the single crystal semiconductor substrate; and
　　irradiating the second impurity semiconductor layer with a laser beam so that a surface of the second impurity semiconductor layer is planarized and a silicide is formed at an interface between the first electrode and the first impurity semiconductor layer,
　　wherein the second impurity semiconductor layer has another conductivity type.

2. The method for manufacturing a photoelectric conversion device according to claim 1,
　　wherein the laser beam is irradiated so that an irradiated region of the second impurity semiconductor layer is heated at a temperature from 250° C. to 600° C.

3. The method for manufacturing a photoelectric conversion device according to claim 1,
　　wherein the ion beam comprises a cluster ion of hydrogen.

4. The method for manufacturing a photoelectric conversion device according to claim 3,
　　wherein the cluster ion of hydrogen is $H_3^+$.

5. The method for manufacturing a photoelectric conversion device according to claim 1,
　　wherein the laser beam is irradiated in a nitrogen atmosphere.

6. The method for manufacturing a photoelectric conversion device according to claim 1,
　　wherein the damaged layer is formed at a depth of less than 10 μm from the first surface.

7. The method for manufacturing a photoelectric conversion device according to claim 1,
　　wherein the supporting substrate is a rectangular glass substrate.

8. The method for manufacturing a photoelectric conversion device according to claim 1,
　　wherein a diameter of the single crystal semiconductor substrate is 300 mm or more.

9. The method for manufacturing a photoelectric conversion device according to claim 1, further comprising the steps of:
　　exposing a part of the first electrode after the step of irradiating the second impurity semiconductor layer;
　　forming an auxiliary electrode in contact with the first electrode; and
　　forming a second electrode over the second impurity semiconductor layer.

10. A method for manufacturing a photoelectric conversion device comprising the steps of:
　　forming a damaged layer in a single crystal semiconductor substrate by irradiating a first surface of the single crystal semiconductor substrate with an ion beam;
　　forming a first impurity semiconductor layer on and in contact with the first surface, wherein the first impurity semiconductor layer has one conductivity type;
　　forming a first electrode on and in contact with the first impurity semiconductor layer;
　　forming a bonding layer over the first electrode;
　　attaching a supporting substrate to the bonding layer;
　　separating a part of the single crystal semiconductor substrate using the damaged layer as a boundary, wherein the part of the single crystal semiconductor substrate is not separated from the supporting substrate;
　　irradiating a second surface of the part of the single crystal semiconductor substrate with a laser beam so that the second surface is planarized and a silicide is formed at an interface between the first electrode and the first impurity semiconductor layer; and
　　forming a second impurity semiconductor layer on the second surface after the step of irradiating the second surface, wherein the second impurity semiconductor layer has another conductivity type.

11. The method for manufacturing a photoelectric conversion device according to claim 10, further comprising the steps of:
　　exposing a part of the first electrode after the step of forming the second impurity semiconductor layer;
　　forming an auxiliary electrode in contact with the first electrode; and
　　forming a second electrode over the second impurity semiconductor layer.

12. The method for manufacturing a photoelectric conversion device according to claim 10,
　　wherein the laser beam is irradiated so that an irradiated region of the part of the single crystal semiconductor substrate is heated at a temperature from 250° C. to 600° C.

13. The method for manufacturing a photoelectric conversion device according to claim 10,
　　wherein the ion beam comprises a cluster ion of hydrogen.

14. The method for manufacturing a photoelectric conversion device according to claim 13,
　　wherein the cluster ion of hydrogen is $H_3^+$.

15. The method for manufacturing a photoelectric conversion device according to claim 10,
　　wherein the laser beam is irradiated in a nitrogen atmosphere.

16. The method for manufacturing a photoelectric conversion device according to claim 10,
　　wherein the damaged layer is formed at a depth of less than 10 μm from the first surface.

17. The method for manufacturing a photoelectric conversion device according to claim 10,
　　wherein the supporting substrate is a rectangular glass substrate.

18. The method for manufacturing a photoelectric conversion device according to claim 10,
　　wherein a diameter of the single crystal semiconductor substrate is 300 mm or more.

19. A method for manufacturing a photoelectric conversion device comprising the steps of:
　　forming a damaged layer in a single crystal semiconductor substrate by irradiating a first surface of the single crystal semiconductor substrate with an ion beam, wherein the ion beam comprises a cluster ion of hydrogen;

forming a first impurity semiconductor layer on and in contact with the first surface, wherein the first impurity semiconductor layer has one conductivity type;

forming a first electrode on and in contact with the first impurity semiconductor layer;

forming a bonding layer over the first electrode;

attaching a supporting substrate to the bonding layer after forming the first impurity semiconductor layer and the first electrode;

separating a part of the single crystal semiconductor substrate using the damaged layer as a boundary, wherein the part of the single crystal semiconductor substrate is not separated from the supporting substrate;

forming a second impurity semiconductor layer on a second surface of the part of the single crystal semiconductor substrate, wherein the second impurity semiconductor layer has another conductivity type; and irradiating the second impurity semiconductor layer with a laser beam so that a surface of the second impurity semiconductor layer is planarized and a silicide is formed at an interface between the first electrode and the first impurity semiconductor layer.

20. The method for manufacturing a photoelectric conversion device according to claim 19,
wherein the laser beam is irradiated so that an irradiated region of the second impurity semiconductor layer is heated at a temperature from 250° C. to 600° C.

21. The method for manufacturing a photoelectric conversion device according to claim 19,
wherein the cluster ion of hydrogen is $H_3^+$.

22. The method for manufacturing a photoelectric conversion device according to claim 19,
wherein the laser beam is irradiated in a nitrogen atmosphere.

23. The method for manufacturing a photoelectric conversion device according to claim 19,
wherein the damaged layer is formed at a depth of less than 10 μm from the first surface.

24. The method for manufacturing a photoelectric conversion device according to claim 19,
wherein the supporting substrate is a rectangular glass substrate.

25. The method for manufacturing a photoelectric conversion device according to claim 19,
wherein a diameter of the single crystal semiconductor substrate is 300 mm or more.

26. The method for manufacturing a photoelectric conversion device according to claim 19, wherein a mass of the cluster ion is heavier than that of a hydrogen molecule.

27. The method for manufacturing a photoelectric conversion device according to claim 19, further comprising the steps of:
exposing a part of the first electrode after the step of irradiating the second impurity semiconductor layer;
forming an auxiliary electrode in contact with the first electrode; and
forming a second electrode over the second impurity semiconductor layer.

28. A method for manufacturing a photoelectric conversion device comprising the steps of:
forming a damaged layer in a single crystal semiconductor substrate by irradiating a first surface of the single crystal semiconductor substrate with an ion beam, wherein the ion beam comprises a cluster ion of hydrogen;

forming a first impurity semiconductor layer on and in contact with the first surface, wherein the first impurity semiconductor layer has one conductivity type;

forming a first electrode on and in contact with the first impurity semiconductor layer;

forming a bonding layer over the first electrode;

attaching a supporting substrate to the bonding layer;

separating a part of the single crystal semiconductor substrate using the damaged layer as a boundary, wherein the part of the single crystal semiconductor substrate is not separated from the supporting substrate;

irradiating a second surface of the part of the single crystal semiconductor substrate with a laser beam so that the second surface is planarized and a silicide is formed at an interface between the first electrode and the first impurity semiconductor layer; and forming a second impurity semiconductor layer on the second surface after the step of irradiating the second surface, wherein the second impurity semiconductor layer has another conductivity type.

29. The method for manufacturing a photoelectric conversion device according to claim 28, further comprising the steps of:
exposing a part of the first electrode after the step of forming the second impurity semiconductor layer;
forming an auxiliary electrode in contact with the first electrode; and
forming a second electrode over the second impurity semiconductor layer.

30. The method for manufacturing a photoelectric conversion device according to claim 28,
wherein the laser beam is irradiated so that an irradiated region of the part of the single crystal semiconductor substrate is heated at a temperature from 250° C. to 600° C.

31. The method for manufacturing a photoelectric conversion device according to claim 28,
wherein the cluster ion of hydrogen is $H_3^+$.

32. The method for manufacturing a photoelectric conversion device according to claim 28,
wherein the laser beam is irradiated in a nitrogen atmosphere.

33. The method for manufacturing a photoelectric conversion device according to claim 28,
wherein the damaged layer is formed at a depth of less than 10 μm from the first surface.

34. The method for manufacturing a photoelectric conversion device according to claim 28,
wherein the supporting substrate is a rectangular glass substrate.

35. The method for manufacturing a photoelectric conversion device according to claim 28,
wherein a diameter of the single crystal semiconductor substrate is 300 mm or more.

36. The method for manufacturing a photoelectric conversion device according to claim 28, wherein a mass of the cluster ion is heavier than that of a hydrogen molecule.

* * * * *